United States Patent
Paolo et al.

(10) Patent No.: US 11,860,199 B2
(45) Date of Patent: Jan. 2, 2024

(54) CURRENT SENSOR FOR A SWITCHING CONVERTER

(71) Applicant: Dialog Semiconductor (UK) Limited, London (GB)

(72) Inventors: Francesco Paolo, Swindon (GB); Ambreesh Bhattad, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 396 days.

(21) Appl. No.: 17/226,526

(22) Filed: Apr. 9, 2021

(65) Prior Publication Data

US 2022/0334153 A1    Oct. 20, 2022

(51) Int. Cl.
*G01R 19/15*       (2006.01)
*G01R 19/165*      (2006.01)

(52) U.S. Cl.
CPC ....... *G01R 19/15* (2013.01); *G01R 19/16547* (2013.01)

(58) Field of Classification Search
CPC .............. G01R 19/15; G01R 19/16547; G01R 19/0092

USPC .................................................. 324/72, 522
See application file for complete search history.

(56) References Cited

U.S. PATENT DOCUMENTS

| | | | | |
|---|---|---|---|---|
| 8,169,224 B2* | 5/2012 | Sander | ............... | G01R 19/0092 |
| | | | | 324/522 |
| 8,779,777 B2* | 7/2014 | Irmer | ................. | G01R 19/0092 |
| | | | | 324/130 |
| 10,794,982 B2* | 10/2020 | Newlin | ............... | G01R 19/0092 |

* cited by examiner

*Primary Examiner* — Steven L Yeninas
*Assistant Examiner* — Rahul Maini
(74) *Attorney, Agent, or Firm* — Saile Ackerman LLC; Stephen B. Ackerman

(57) ABSTRACT

An apparatus for a first current sensor for a switching converter has an inductor and a first switch. The first switch is arranged to selectively couple the inductor to a first voltage. The first current sensor generates a first output current that is dependent on an inductor current flowing through the inductor The first current sensor compensates for an error arising due to the first switch in the generation of the first output current. The apparatus provides an improved current sensor for a switching converter that overcomes or mitigates the problem of errors in the measurement of a current.

17 Claims, 20 Drawing Sheets

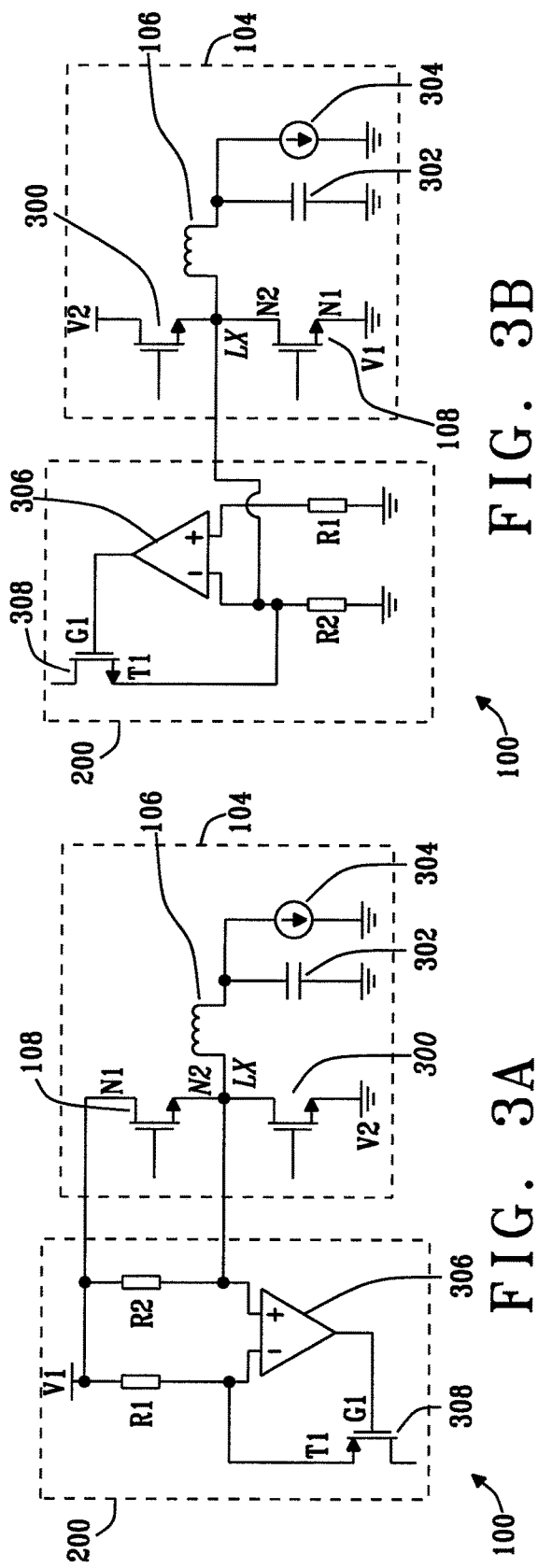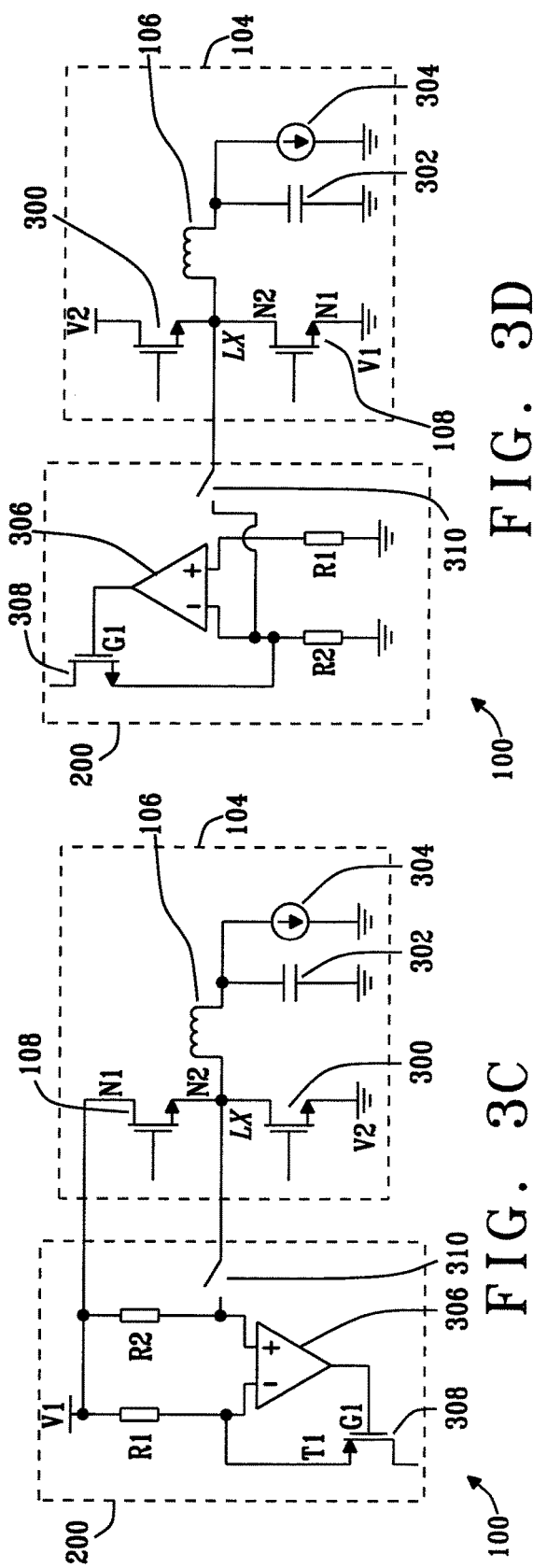
FIG. 3A  FIG. 3B  FIG. 3C  FIG. 3D

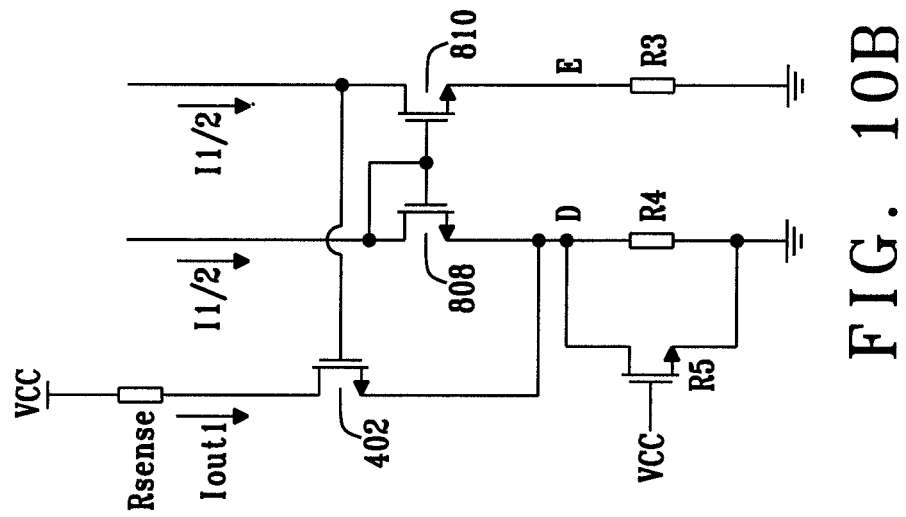
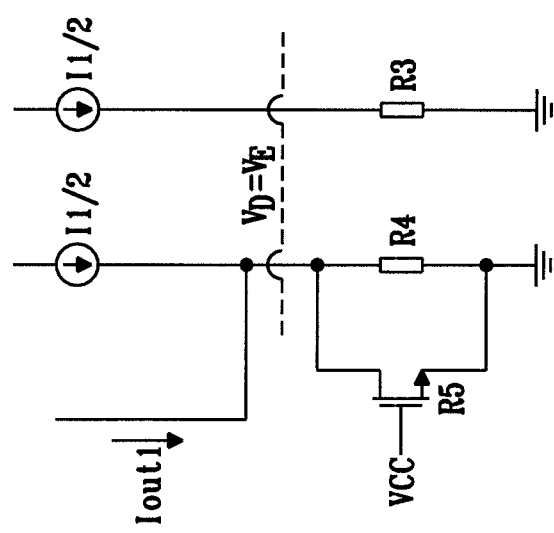
FIG. 10B
FIG. 10A

CURRENT SENSOR FOR A SWITCHING CONVERTER

TECHNICAL FIELD

The field of the application is current sensing, in particular for DC-DC converters (switch mode power converters), for example a step-down, or buck converter that outputs a lower voltage than the input voltage. The present disclosure relates to an apparatus comprising a current sensor for a switching converter.

BACKGROUND

The sensed current that is sensed by known current sensors may be subject to errors in measurement. This means that the sensed current does not match the true value of the current to be measured.

SUMMARY

It is desirable to provide an improved current sensor for a switching converter that overcomes or mitigates the problem of errors in the measurement of a current.

According to a first aspect of the disclosure there is provided an apparatus comprising a first current sensor for a switching converter comprising an inductor and a first switch, the first switch being arranged to selectively couple the inductor to a first voltage, the first current sensor being configured to i) generate a first output current that is dependent on an inductor current flowing through the inductor, and ii) at least partially compensate for an error arising due to the first switch in the generation of the first output current.

Optionally, the error arises due to an impedance of the first switch.

Optionally, the error arises due to a temperature dependency of an impedance of the first switch, and/or an offset in a physical value of the impedance of the first switch from an intended value of the impedance.

Optionally, the first current sensor comprises a first stage configured to generate a first current that is dependent on the inductor current, the first current comprising a current error, the current error resulting from the error arising due to the first switch, and a second stage configured to i) receive the first current, and ii) generate the first output current by at least partially compensating for the current error of the first current.

Optionally, the first stage comprises a first differential amplifier, a first resistive element, a second resistive element configured to be couplable to the first switch in a parallel coupling configuration, wherein the first differential amplifier is configured to generate the first current that is dependent on the impedances of the first resistive element, the second resistive element and the first switch.

Optionally, the first current sensor comprises a safety switch having a first terminal coupled to the second resistive element and a second terminal configured to be couplable to the inductor.

Optionally, an output of the first differential amplifier is coupled to a gate of a first transistor, a negative input of the first differential amplifier is coupled to a first terminal of the first transistor.

Optionally, the second stage comprises a second differential amplifier, a third resistive element, a fourth resistive element, and a fifth resistive element coupled in parallel with the fourth resistive element, thereby forming a parallel combination; wherein the second differential amplifier is configured to generate the first output current that is dependent on the first current and the impendences of the third, fourth and fifth resistive elements.

Optionally, an output of the second differential amplifier is coupled to a gate of a second transistor, a negative input of the second differential amplifier is coupled to a first terminal of the second transistor.

Optionally, the third resistive element is coupled to a positive input of the second differential amplifier, and the parallel combination of the fourth and fifth resistive elements is coupled to a negative input of the second differential amplifier.

Optionally, the third resistive element is configured to receive a first portion of the first current and the parallel combination of the fourth and fifth resistive elements are configured to receive a second portion of the first current.

Optionally, the first and second current portions are each approximately equal to half of the first current.

Optionally, the second stage comprises a current divider configured to divide the first current into a first portion and a second portion.

Optionally, the first and second current portions are each approximately equal to half of the first current.

Optionally, the second stage comprises a current divider configured to divide the first current into a first portion and a second portion, provide the first portion of the first current to the third resistive element, and provide the second portion of the first current to the parallel combination of the fourth and fifth resistive elements.

Optionally, the first and second current portions are each approximately equal to half of the first current.

Optionally, the second stage comprises a second differential amplifier, a third resistive element, a fourth resistive element, and a fifth resistive element coupled in parallel with the fourth resistive element, thereby forming a parallel combination, wherein the second differential amplifier is configured to generate the first output current that is dependent on the first current and the impendences of the third, fourth and fifth resistive elements Optionally, the third resistive element is coupled to a positive input of the second differential amplifier, and a parallel combination of the fourth and fifth resistive elements is coupled to a negative input of the second differential amplifier.

Optionally, the third resistive element is configured to receive a first potion of the first current and the parallel combination of the fourth and fifth resistive elements are configured to receive a second portion of the first current.

Optionally, the second stage comprises a current divider configured to divide the first current into a first portion and a second portion, provide the first portion of the first current to the third resistive element, and provide the second portion of the first current to the parallel combination of the fourth and fifth resistive elements.

Optionally, the first switch comprises a high side switch, the high side switch comprising a first terminal coupled to the first voltage and a second terminal coupled to the inductor at an inductor node.

Optionally, the first current sensor comprises a first stage configured to generate a first current that is dependent on the inductor current, the first current comprising a current error, the current error resulting from the error arising due to the first switch, and a second stage configured to i) receive the first current, and ii) generate the first output current by at least partially compensating for the current error of the first current.

Optionally, the first stage comprises a first differential amplifier, a first resistive element, a second resistive element configured to be couplable to the first switch in a parallel coupling configuration, wherein the first differential amplifier is configured to generate the first current that is dependent on the impedances of the first resistive element, the second resistive element and the first switch.

Optionally, the first resistive element is coupled to a negative input of the first differential amplifier; and a parallel combination of the second resistive element and the high side switch is coupled to a positive input of the first differential amplifier.

Optionally, the first stage comprises an offset resistive element, the parallel combination of the second resistive element and the high side switch being coupled to the positive input of the first differential amplifier via the offset resistive element.

Optionally, an output of the first differential amplifier is coupled to a gate of a first transistor, and the negative input of the first differential amplifier is coupled to a first terminal of the first transistor.

Optionally, the first switch comprises a low side switch, the low side switch comprising a first terminal coupled to the first voltage and a second terminal coupled to an inductor at an inductor node.

Optionally, the first current sensor comprises a first stage configured to generate a first current that is dependent on the inductor current, the first current comprising a current error, the current error resulting from the error arising due to the first switch, and a second stage configured to i) receive the first current, and ii) generate the first output current by at least partially compensating for the current error of the first current.

Optionally, the first stage comprises a first differential amplifier, a first resistive element, a second resistive element configured to be couplable to the first switch in a parallel coupling configuration, wherein the first differential amplifier is configured to generate the first current that is dependent on the impedances of the first resistive element, the second resistive element and the first switch.

Optionally the first resistive element is coupled to a positive input of the first differential amplifier, and a parallel combination of the second resistive element and the low side switch is coupled to a negative input of the first differential amplifier Optionally, the first stage comprises an offset resistive element, the parallel combination of the second resistive element and the high side switch being coupled to the negative input of the first differential amplifier via the offset resistive element.

Optionally, an output of the first differential amplifier is coupled to a gate of a first transistor, and the negative input of the first differential amplifier is coupled to a first terminal of the first transistor.

Optionally, the first current sensor comprises a current mirror transistor configured to receive the first current, and to mirror the first current to the second stage.

Optionally, the switching converter comprises a second switch, the second switch being arranged to selectively couple the inductor to a second voltage, the apparatus comprising a second current sensor being configured to i) generate a second output current that is dependent on the inductor current flowing through the inductor, and ii) at least partially compensate for an error arising due to the second switch in the generation of the second output current.

Optionally, the apparatus is configured to generate a total output current comprising the first and second output currents.

Optionally, the first current sensor comprises a first current sensor stage configured to generate a first current that is dependent on the inductor current, the first current comprising a first current error, the first current error resulting from the error arising due to the first switch, and the second current sensor comprises a second current sensor stage configured to generate a second current that is dependent on the inductor current, the second current comprising a second current error, the second current error resulting from the error arising due to the second switch, wherein the current sensing apparatus comprises an output stage configured to i) receive the first and second currents, and ii) generate a total output current by at least partially compensating for the current errors of the first and second currents.

Optionally, the apparatus comprises the switching converter.

Optionally, the switching converter is a buck converter.

According to a second aspect of the disclosure there is provided a method of current sensing an inductor current of a switching converter comprising an inductor and a first switch, the first switch being arranged to selectively couple the inductor to a first voltage, the method comprising i) generating a first output current that is dependent on the inductor current flowing through the inductor using a first current sensor, and ii) compensating, at least partially, for an error arising due to the first switch in the generation of the first output current using the first current sensor.

Optionally, the method comprises iii) generating a second output current that is dependent on the inductor current flowing through the inductor using a second current sensor, and iv) compensating, at least partially, for an error arising due to the second switch in the generation of the second output current using the second current sensor.

Optionally, the method comprises generating a total output current that comprises the first and second output currents.

It will be appreciated that the method of the second aspect may include features set out in the first aspect and can incorporate other features as described herein.

BRIEF DESCRIPTION OF THE DRAWINGS

The disclosure is described in further detail below by way of example and with reference to the accompanying drawings, in which:

FIG. 3A is a schematic of the apparatus of FIG. 1, showing a specific implementation of the first stage in accordance with a third embodiment of the present disclosure, FIG. 3B is a schematic of the apparatus of FIG. 1, showing a specific implementation of the first stage in accordance with a fourth embodiment of the present disclosure, FIG. 3C is a schematic of a further embodiment of the apparatus of FIG. 3A, FIG. 3D is a schematic of a further embodiment of the apparatus of FIG. 3B;

FIG. 10A is a schematic illustrating current flows through the second stage of the apparatus of FIG. 8, FIG. 10B is a further schematic illustrating current flows through the second stage of the apparatus of FIG. 8;

DESCRIPTION

Figure 1:
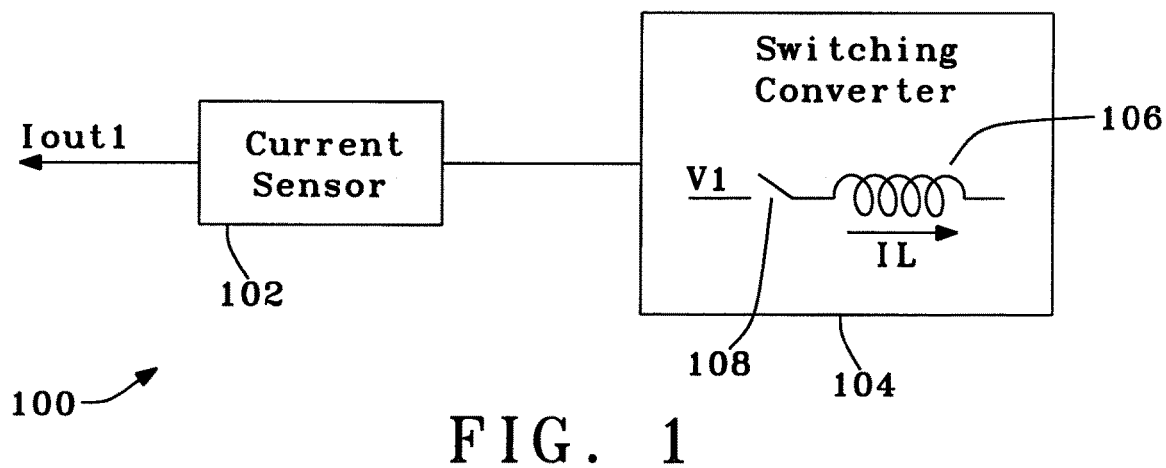
FIG. 1 is a schematic of an apparatus comprising a current sensor in accordance with a first embodiment of the present disclosure.

FIG. 1 is a schematic of an apparatus 100 comprising a current sensor 102 in accordance with a first embodiment of the present disclosure.

The current sensor 102 is for a switching converter 104 comprising an inductor 106 and a switch 108. The switch 108 is arranged to selectively couple the inductor 106 to a voltage V1. By "selectively couple" it is meant that the switch 108 acts to couple the inductor 106 to the voltage V1 or to decouple the inductor 106 from the voltage V1 based on a control signal received by the switch 108 during operation of the switching converter. The switch 108 may comprise a transistor, for example a p-type or an n-type transistor, with the control signal being received at a gate of the transistor. The voltage V1 may, for example, be referred to as a supply voltage, an input voltage or ground depending on the application. The switching converter 104 may be a DC-DC converter, for example a buck converter, a boost converter or a buck-boost converter.

The current sensor 102 is configured to generate an output current Iout1 that is dependent on an inductor current IL flowing through the inductor 106, and to at least partially compensate for an error arising due to the switch 108 in the generation of the output current Iout1.

The error may arise due to an impedance of the switch 108. This may, for example, be an on-resistance of the transistor, when the switch 108 comprises the transistor.

The error may, for example, arise due to a temperature dependency of the impedance of the switch 108, and/or an offset in a physical value of the impedance of the switch 108 from an intended value of the impedance. The intended value may be the value of the impedance resulting from the switching converter 104 specification with the true value of the impedance of the physical implementation of the switch 108 varying from the intended value, for example, due to process variations and/or imperfections.

The sensed current (in the present example Iout1) can be used for current monitoring or as a loop control mechanism.

Figure 2:
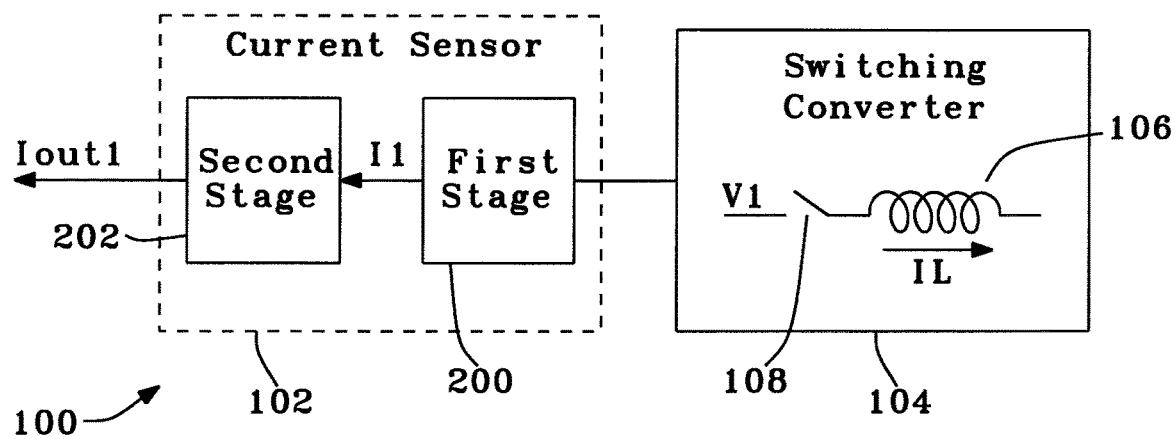
FIG. 2 is a schematic of the apparatus of FIG. 1, showing a specific implementation of the current sensor and according to a second embodiment of the present disclosure.

FIG. 2 is a schematic of the apparatus 100, showing a specific implementation of the current sensor 102, and according to a second embodiment of the present disclosure. The current sensor 102 comprises a first stage 200 configured to generate a current I1 that is dependent on the inductor current IL. The current I1 comprises a current error. The current error results from the error arising due to the switch 108.

The current sensor 102 further comprises a second stage 202 configured to receive the current I1 and to generate the output current Iout1 by at least partially compensating for the current error of the current I1.

Common reference numerals and variables between Figures denote common features.

FIG. 3A is a schematic of the apparatus 100, showing a specific implementation of the first stage 200 in accordance with a third embodiment of the present disclosure.

In the present example the switching converter 104 further comprises a switch 300, a capacitor 302 and is coupled to a load 304.

The switches 108, 300 may comprise, for example, be PMOS or NMOS transistors. In the present example, the switches 108, 300 comprise high voltage NMOS transistors that function as pass devices.

The first stage 200 comprises a differential amplifier 306 a resistive element R1, and a resistive element R2. The resistive element R2 is coupled in parallel to the switch 108. The differential amplifier 306 is configured to generate the current I1, which is dependent on the impedances of the resistive element R1, R2 and the switch 108. The resistive elements may, for example, comprise one or more of a transistor and/or a resistor.

An output of the differential amplifier 306 may be coupled to a gate G1 of a transistor 308. A negative input of the differential amplifier 306 may be coupled to a first terminal T1 of the transistor 308.

In the present example the switch 108 comprises a high side switch of the switching converter 104. The high side switch comprises a terminal N1 coupled to the voltage V1 and a terminal N2 coupled to the inductor 106 at an inductor node LX.

The resistive element R1 may be coupled to the negative input of the differential amplifier 306, and a parallel combination of the resistive element R2 and the high side switch (provided by the switch 108) may be coupled to a positive input of the differential amplifier 306.

Also shown is a voltage V2 which is less than the voltage V1 in the present example. In the present example V2 is a ground.

FIG. 3B is a schematic of the apparatus 100, showing a specific implementation of the first stage 200 in accordance with a fourth embodiment of the present disclosure.

In the present embodiment, the switch 108 comprises a low side switch. The low side switch comprises the terminal N1 coupled to the voltage V1 and the terminal N2 coupled to the inductor 106 at the inductor node LX. Also shown is a voltage V2 which is greater than the voltage V1 in the present example. In the present example V1 is a ground.

In the present embodiment, the resistive element R1 is coupled to the positive input of the differential amplifier 306, and the parallel combination of the resistive element R2 and the low side switch (provided by the switch 108) is coupled to the negative input of the differential amplifier 306. It should be noted that this differs from the configuration shown in FIG. 3A.

FIG. 3C is a schematic of a further embodiment of the apparatus 100 of FIG. 3A, where the current sensor 102 further comprises a safety switch 310 having a terminal S1 coupled to the resistive element R2 and a terminal S2 coupled to the inductor 106. The switch 310 may comprise a transistor, for example a field effect transistor (FET), such as a MOSFET. In operation, the switch 310 may be controlled by the same control signal of the switch 108, so they are opened and closed simultaneously.

The switch 310 is arranged to disconnect an input of the first stage 200 from the LX node. When the high side is OFF (the switch 108 is open) and the low side is ON (the switch 300 is closed). Without the switch 310, there would be a path from the voltage V1 to ground which can compromise the state of the circuit components, causing current consumption and changing the operating point of the first stage 200 every time that switch 108 changes between ON and OFF. Therefore, the switch 310 can mitigate or resolve these issues.

FIG. 3D is a schematic of a further embodiment of the apparatus 100 of FIG. 3B including the safety switch 310.

Figure 4A:
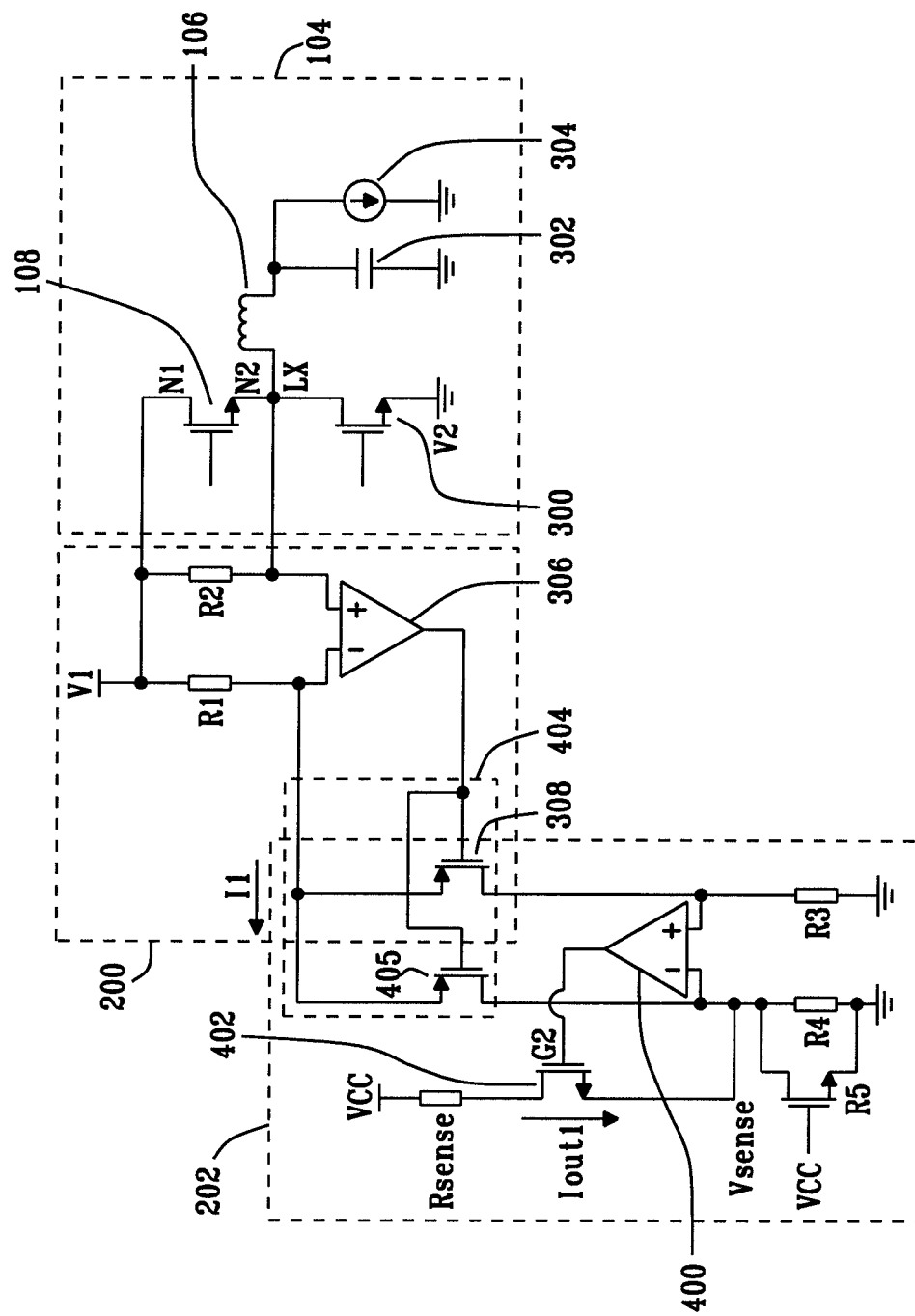
FIG. 4A is a schematic of the apparatus of FIG. 1, showing a specific implementation of the second stage in accordance with a fifth embodiment of the present disclosure.

FIG. 4A is a schematic of the apparatus 100, showing a specific implementation of the second stage 202 in accordance with a fifth embodiment of the present disclosure. In the present example, the switch 108 is a high side switch of the switching converter 104.

The second stage 202 comprises a differential amplifier 400, a resistive element R3, a resistive element R4, and a resistive element R5. The resistive element R5 is coupled in parallel with the resistive element R4, thereby forming a parallel combination. The differential amplifier 400 is configured to generate the output current Iout1 that is dependent on the current I1 and the impendences of the resistive elements R3, R4, R5.

The differential amplifiers 306, 400 may be implemented as common gate amplifiers.

Each of the resistive elements R3, R4, R5 may comprise one or more of a transistor and/or a resistor. In the present embodiment the resistive element comprises a transistor having its gate coupled to a supply voltage VCC.

An output of the differential amplifier 400 may be coupled to a gate G2 of a transistor 402. A negative input of the differential amplifier 400 may be coupled to a terminal TA of the transistor 402.

The resistive element R3 may be coupled to a positive input of the differential amplifier 400 and a parallel combination of the resistive elements R4, R5 may be coupled to the negative input of the differential amplifier 400.

In operation, the resistive element R3 may receive a first portion of the current I1 and the parallel combination of the resistive elements R4, R5 may receive a second portion of the current I1. Preferably, first and second current portions are each approximately equal to half of the current I1.

In a further embodiment, the second stage 202 may comprise a current divider 404 configured to divide the current I1 into the first portion and the second portion. In the present embodiment, the current divider comprises the transistor 308 and a transistor 405.

The current divider 404 may be configured to provide the first portion of the current I1 to the resistive element R3, and to provide the second portion of the current I1 to the parallel combination of the resistive elements R4, R5.

In the present embodiment, the apparatus further comprises a sense resistor Rsense coupled to the supply voltage VCC which is used to generate a sense voltage Vsense that is representative the output current Iout1. The sense voltage Vsense, may, for example, be measured at the location as shown on the Figure.

In operation, the first stage 200 senses a voltage across the high side switch 108 and generates the current I1 that is proportional to the inductor current IL. The current I1 also contains information of the temperature variation, as the resistive elements R1, R2 vary in temperature differently from the switch 108.

In operation the current I1 of the first stage 200 is split in two and it is pushed into two impedances (provided by the resistive elements R3 and the parallel combination of R4, R5).

The impedances of the second stage 202 provided by the resistive elements R3, R4, R5 are of the same type of the impedance of the first stage 200 (as provided by the resistive elements R1, R2) but connected in opposite way to the differential amplifier. Specifically, R1 is of the same type as R3 but they are coupled to different differential amplifier input types. Furthermore, R2 is of the same type as R4 and R5 is of the same type as the switch 108. In this way, the gain function provided by the differential amplifier 400 of the second stage 202 has an opposite temperature characteristic compared to the gain function of the differential amplifier 306 of the first stage 200, thereby performing the temperature compensation. Furthermore, as the resistive elements R1, R2, R3, R4, R5 are all subject to the same process variations, any variations due to process are also compensated for. Therefore in operation, the output current Iout1 is compensated in respect of these errors.

In summary, in the present example, the two operations of sensing the inductor current IL and compensating errors are split in the two different gain stages provided by the first stage 200 and the second stage 202.

Figure 4B:
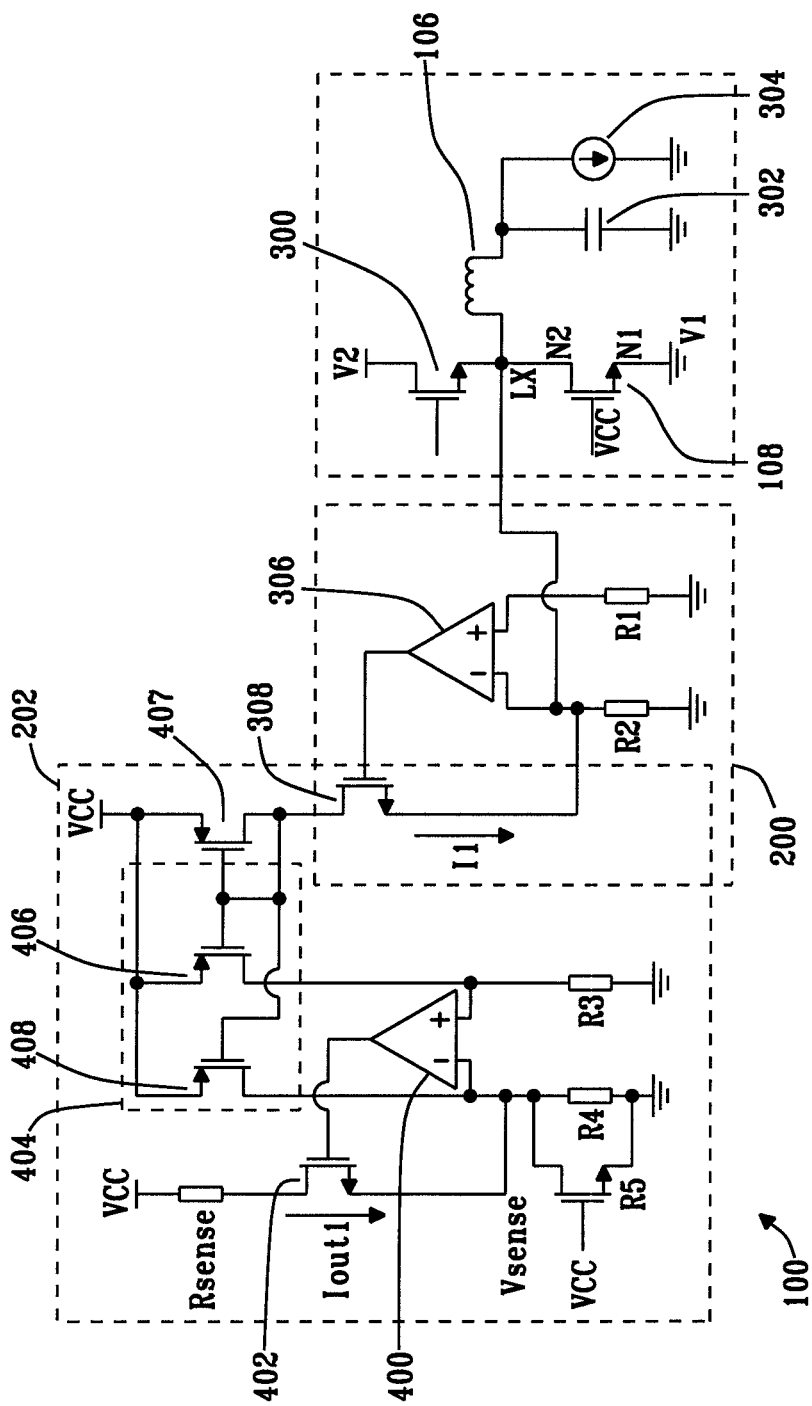
FIG. 4B is a schematic of the apparatus of FIG. 1, showing a specific implementation of the second stage in accordance with a sixth embodiment of the present disclosure.

FIG. 4B is a schematic of the apparatus 100, showing a specific implementation of the second stage 202 in accordance with a sixth embodiment of the present disclosure. In the present example, the switch 108 is a low side switch of the switching converter 104.

In the present embodiment, the current sensor 102 comprises a current mirror transistor 407 configured to receive the current I1, and to mirror the current I1 to the second stage 202. In the present example, the current divider 404 comprises a transistor 406 and a transistor 408.

All of the observations made for the high side, as described in FIG. 4A are valid for the low side sense as described in FIG. 4B. There are however some minor differences:

The current mirror is used for practical reason such as:
- Generating an output current from the second stage 202 of the same type of the high side second stage 202, so they can be connected to the same node.
- It is easier to drive the transistor of the R5 device because its source is connected to ground and its gate can be connected to the existing voltage rail VCC.

Figure 5A:
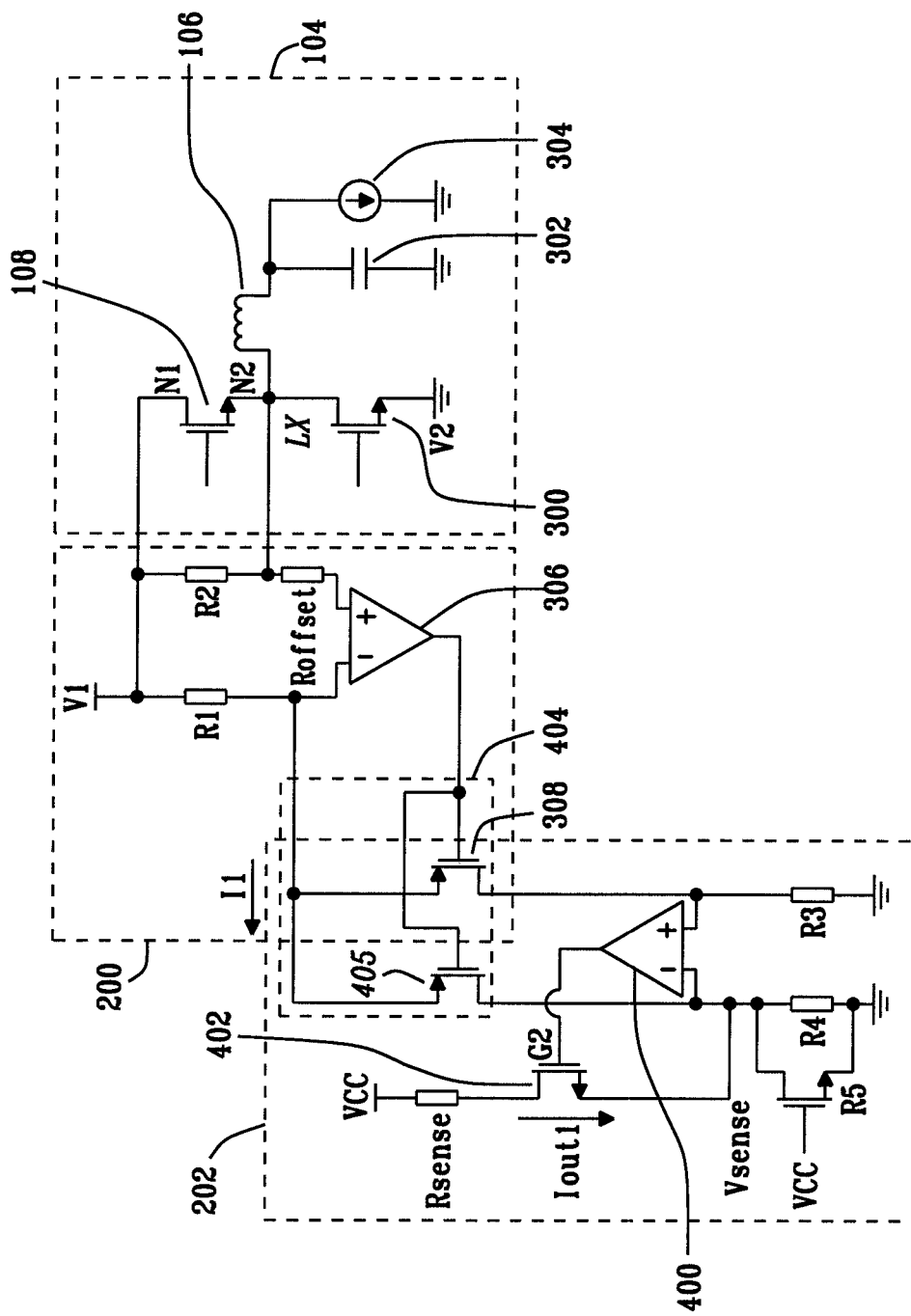
FIG. 5A is a schematic of an alternative embodiment of the apparatus presented in FIG. 4A.

FIG. 5A is a schematic of an alternative embodiment of the apparatus 100 presented in FIG. 4A. In the present embodiment, the first stage 200 further comprises an offset resistive element Roffset, for example a resistor. The parallel combination of the resistive element R2 and the switch 108 are coupled to the positive input of the differential amplifier 306 via the offset resistive element Roffset.

Figure 5B:
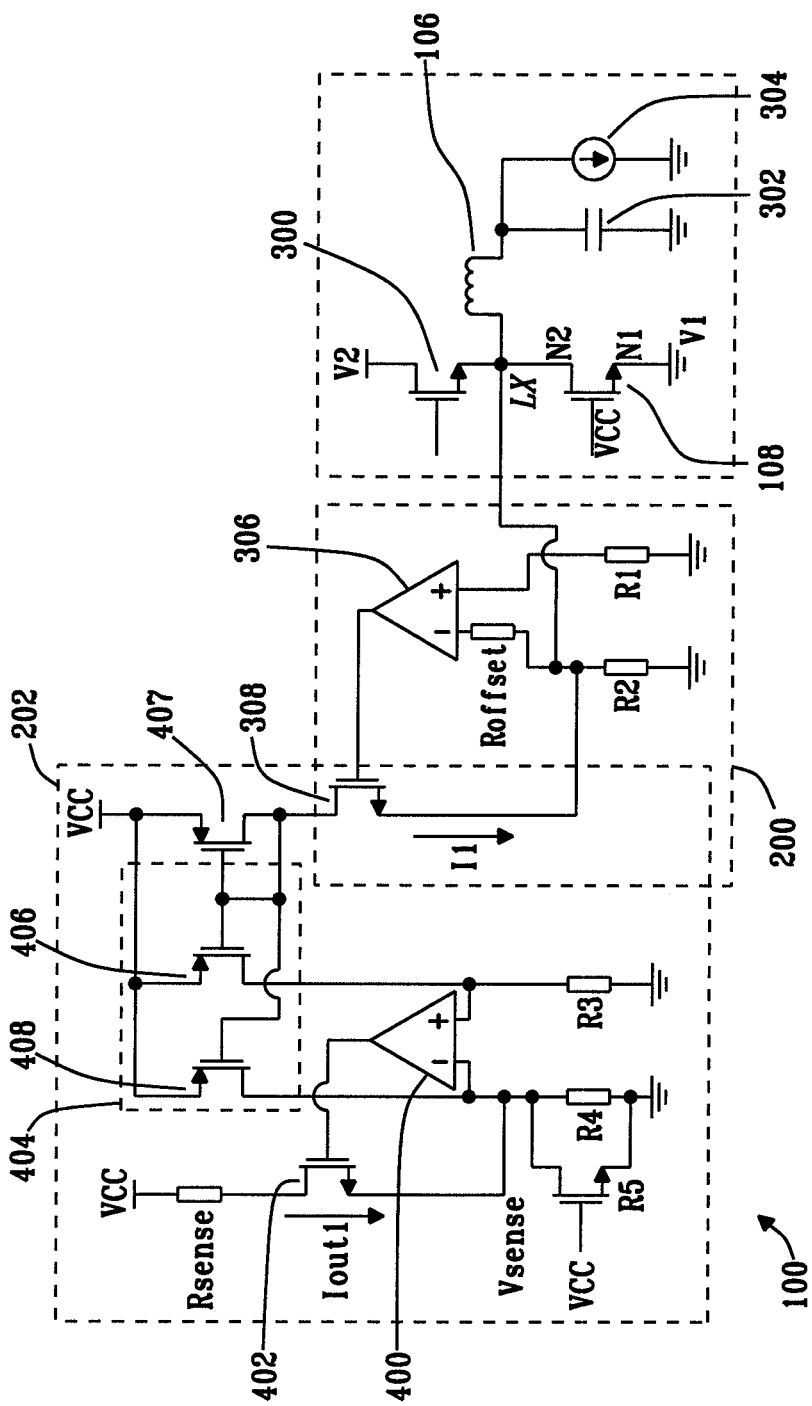
FIG. 5B is a schematic of an alternative embodiment of the apparatus presented in FIG. 4B.

FIG. 5B is a schematic of an alternative embodiment of the apparatus 100 presented in FIG. 4B. In the present embodiment, the first stage 200 further comprises the offset resistive element Roffset, for example a resistor. The parallel combination of the resistive element R2 and the switch 108 are coupled to the negative input of the differential amplifier 306 via the offset resistive element Roffset.

The offset resistive element Roffset may be a resistor used to adjust an offset current of the first stage 200, in order to improve accuracy at low current and dynamic response.

The LX node is connected between R2 and Roffset because, the current in the low side pass device (the switch 108) flows from source to drain (opposite direction of the high side) and it generates a negative drain source voltage Vds. Since the LX node is negative, it is connected to the negative input terminal of the differential pair of the differential amplifier 306.

Figure 6:
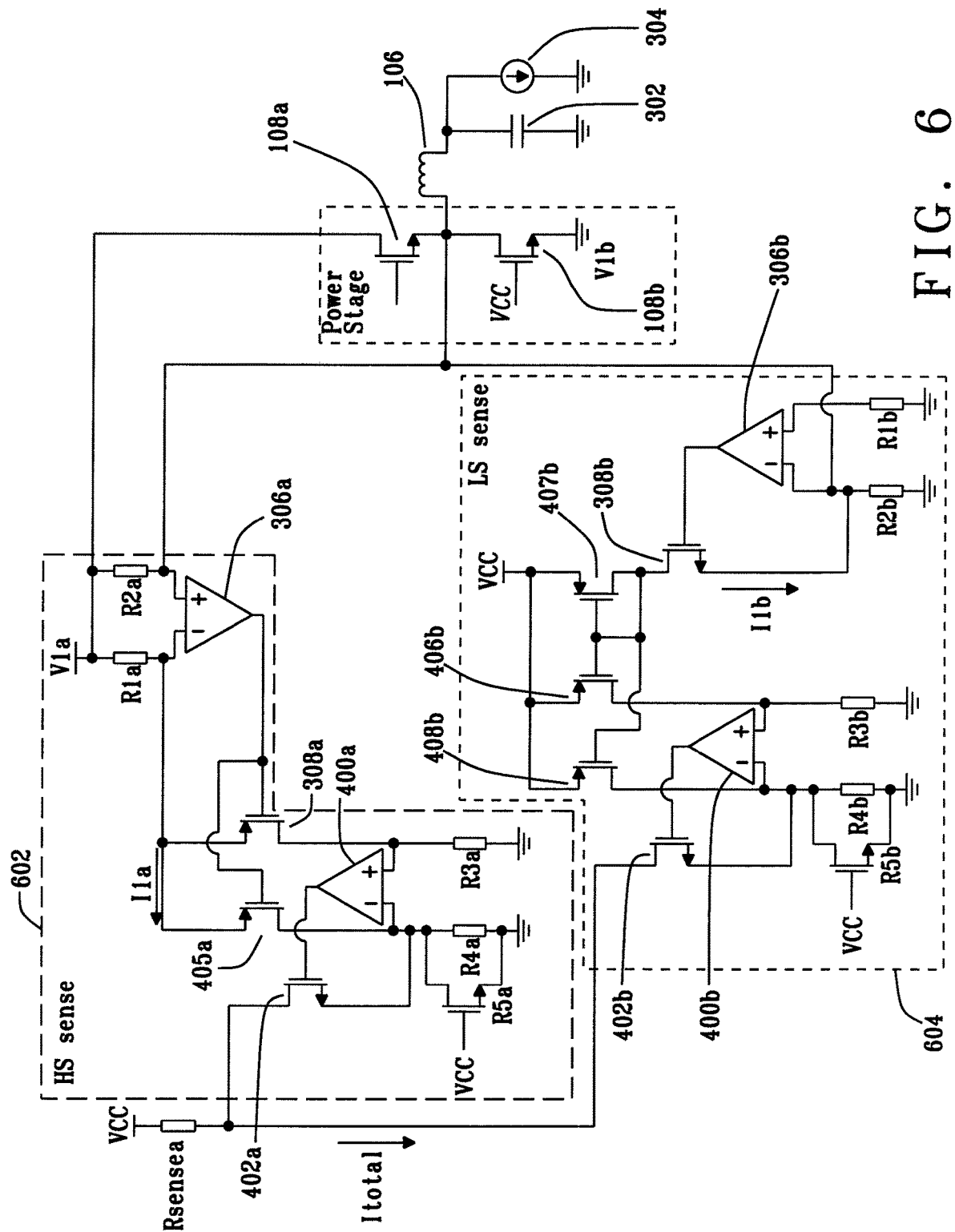
FIG. 6 is a schematic of an apparatus comprising two current sensors in accordance with a seventh embodiment of the present disclosure.

FIG. 6 is a schematic of an apparatus 600 comprising two current sensors 602, 604 in accordance with a seventh embodiment of the present disclosure. The current sensors 602, 604 may be provided by any of the current sensors as described herein and in accordance with the understanding of the skilled person.

The current sensor 602 is applied to a high side switch of the switching converter 104 and the current sensor 604 is applied to a low side switch of the switching converter 104. For clarity of labelling, the reference numerals as previously defined in relation to single current sensors will be followed by "a" when described in relation to the current sensor 602, and will be followed by "b" when described in relation to the current sensor 604. For example, the switch 108a is the high side switch that the current sensor 602 is coupled to, whereas the switch 108b is the low side switch, that the current sensor 604 is coupled to. In operation, there is generated a total output current Itotal, that comprises the output currents Iout1a and Iout1b as generated by the current sensor 602 and the current sensor 604, respectively. The total output current Itotal represents a reproduction of the inductor current IL as it includes the combination of the output currents Iout1a, Iout1b.

Figure 7:
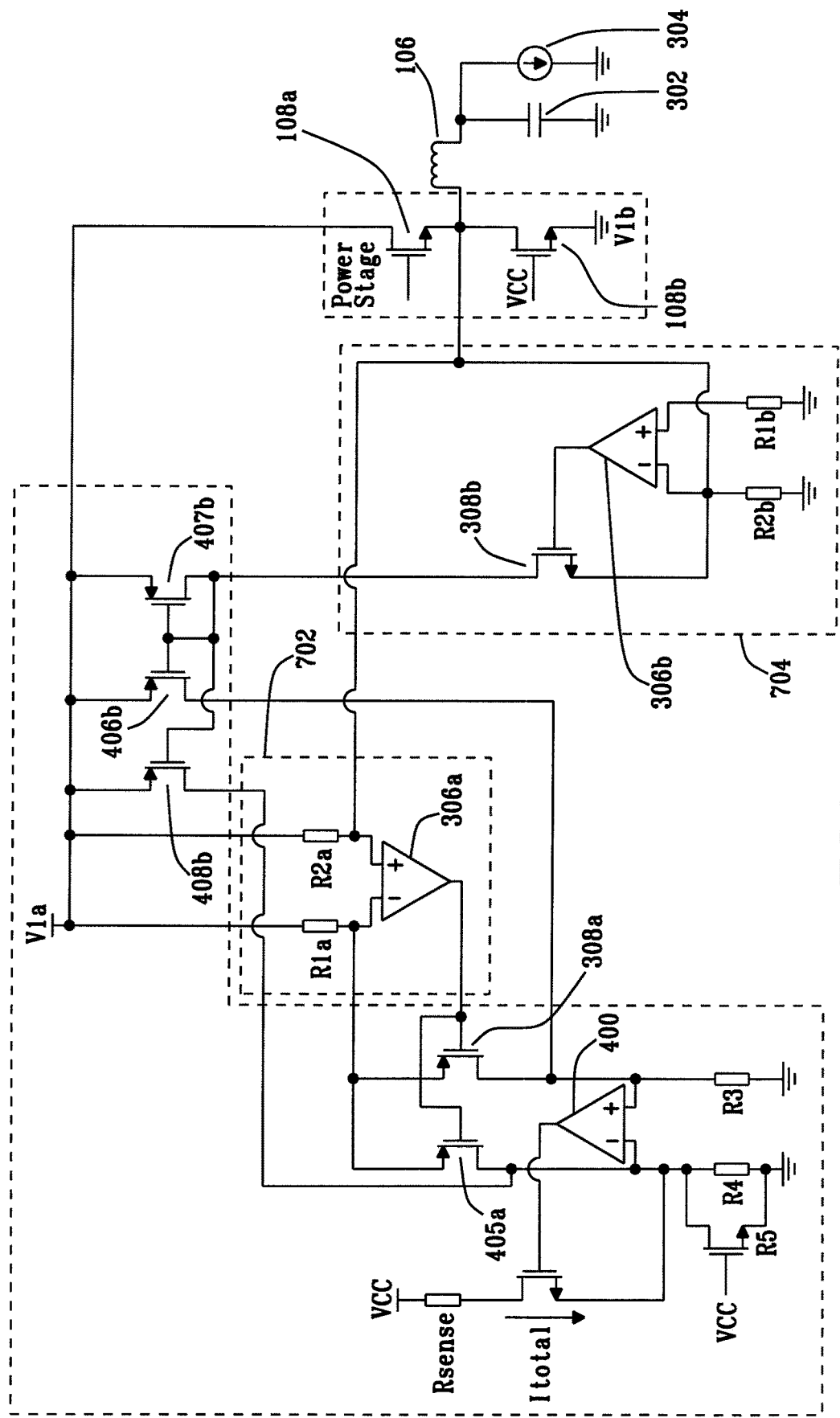
FIG. 7 is a schematic of an apparatus in accordance with an eighth embodiment.

FIG. 7 is a schematic of an apparatus 700 in accordance with an eighth embodiment. The apparatus 700 comprises current sensors 702, 704, where the current sensor 702 is coupled to the high side switch 108a and the current sensor 704 is coupled to the low side switch 108b. In the present example, the second stage 202 is shared between both of the current sensors 702, 704. The apparatus 600 functions otherwise as described for the apparatus 700 as will be clear to the skilled person. In the present example, the second stage 202 performs the same gain function in the high side current sense (the current sensor 702) and the low side current sense (the current sensor 704).

Figure 8:
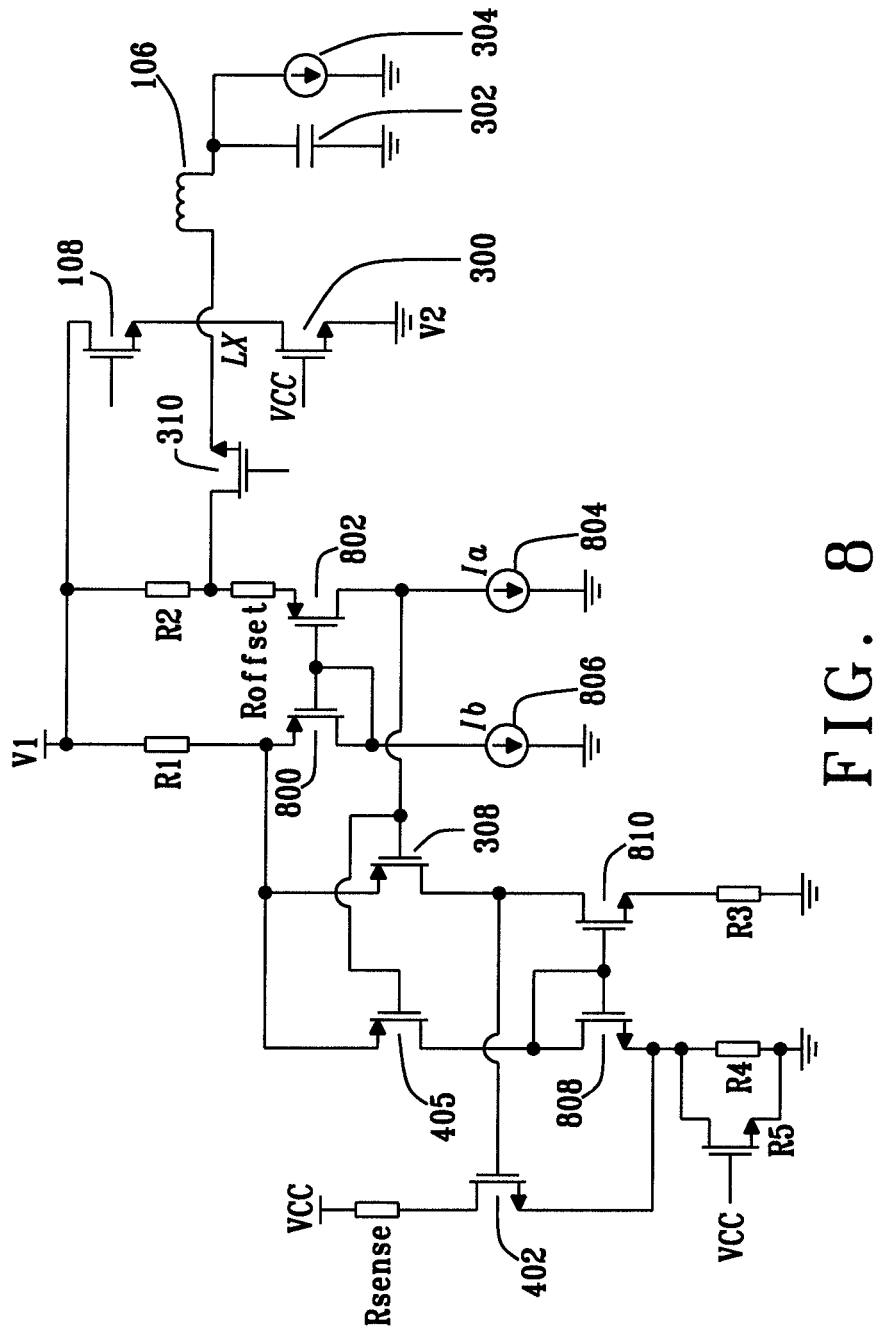
FIG. 8 is a schematic of the apparatus of FIG. 1 for a specific embodiment of the stages for use with a high side switch.

FIG. 8 is a schematic of the apparatus 100 for a specific embodiment of the stages 200, 202 for use with a high side switch 108. In the present embodiment, the differential amplifier 306 comprises transistors 800, 802 and current sources 804, 806, where the current source 804 has a current Ia and the current source 806 has a current Ib. The differential amplifier 400 comprises transistors 808, 810.

Figure 9B:
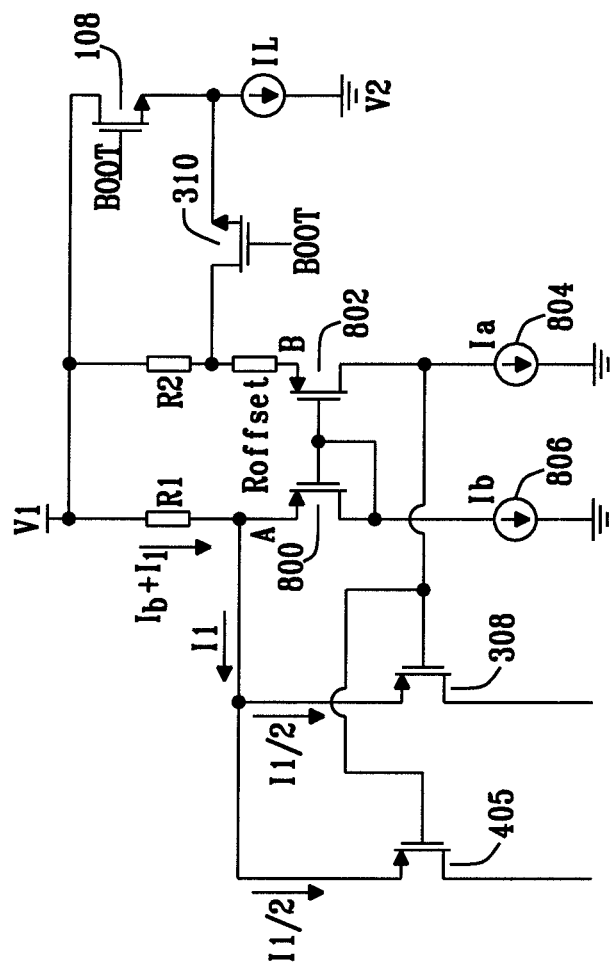
FIG. 9B is a further schematic illustrating current flows through the first stage of the apparatus of FIG. 8.
Figure 9A:
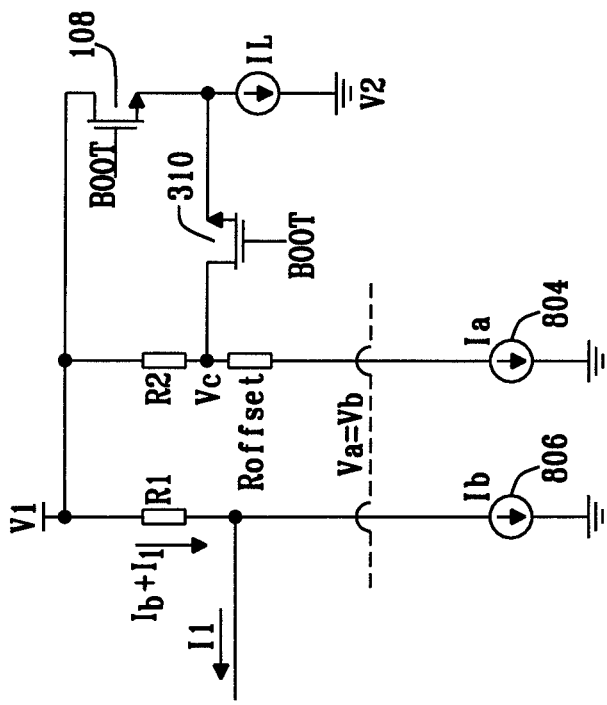
FIG. 9A is a schematic illustrating current flows through the first stage of the apparatus of FIG. 8.

FIG. 9A and FIG. 9B are schematics illustrating current flows through the first stage 200 of the apparatus of FIG. 8.

FIG. 10A and FIG. 10B are schematics illustrating current flows through the second stage 202 of the apparatus of FIG. 8.

The following is provided as analysis for the first stage 200 for high side switch current sensing.

The feedback loop forces node "A" equal to node "B", assuming that the resistance of the switch 310 is negligible, compared with R2.

$$V_A = (Ib+I1) \cdot R1 \qquad (1)$$

$$V_B = V_C + Ia \cdot \text{Roffset} \qquad (2)$$

$$V_C = Ia \cdot \text{Rtotal}(R2, R108) + IL \cdot \text{Rtotal}(R2, R108) \qquad (3)$$

Rtotal(R2, R108) is the total resistance of the parallel combination of the resistive element R2 and the switch 108, where R108 is the resistance of the switch 108.

Imposing $V_A = V_B$ yields the following relation:

$$(Ib+I1) \cdot R1 = Ia \cdot \text{Rtotal}(R2, R108) + IL \cdot \text{Rtotal}(R2, R108) + Ia \cdot \text{Roffset} \qquad (4)$$

The output current of the first stage 200 is then as follows:

$$I1 = IL \cdot \frac{\text{Rtotal}(R2, R108)}{R1} + Ia \cdot \frac{\text{Rtotal}(R2, R108) + \text{Roffset}}{R1} - Ib \qquad (5)$$

The following is provided as analysis for the second stage 202 for high side switch current sensing.

The feedback loop forces node "D" equal to node "E".

$$V_D = \left(Iout1 + \frac{I1}{2}\right) \cdot \text{Rtotal}(R4, R5) \qquad (6)$$

Rtotal(R4, R5) is the total resistance of the parallel combination of the resistive elements R4, R5.

$$V_E = \frac{I1}{2} \cdot R3 \qquad (7)$$

Imposing $V_D = V_E$:

$$\left(Iout1 + \frac{I1}{2}\right) \cdot \text{Rtotal}(R4, R5) = \frac{I1}{2} \cdot R3 \qquad (8)$$

The output current Iout1 of the second stage 202 is:

$$Iout1 = \frac{I1}{2} \cdot \left(\frac{R3}{\text{Rtotal}(R4, R5)} - 1\right) = \frac{I1}{2} \cdot \left(\frac{R3 - \text{Rtotal}(R4, R5)}{\text{Rtotal}(R4, R5)}\right) \qquad (9)$$

We may then consider the combinations of the gain functions provided by the first and second stages 200, 202.

The output current I1 of the first stage 200 is provided by equation (5). The output current Iout1 of the second stage 202 is provided by equation (9). Combining these equations yields the following:

$$Iout1 = \frac{1}{2}\left[\left(IL \cdot \frac{Rtotal(R2, R108)}{R1}\right) \cdot \left(\frac{R3}{Rtotal(R4, R5)} - 1\right)\right. \qquad (10)$$
$$\left. + \left(Ia \cdot \frac{Rtotal(R3, R108) + Roffset}{R1} - Ib\right) \cdot \left(\frac{R3}{Rtotal(R4, R5)} - 1\right)\right]$$

Equation (10) includes an offset term:

$$Ioffset = \qquad (11)$$
$$\frac{1}{2} \cdot \left(Ia \cdot \frac{Rtotal(R3, R108) + Roffset}{R1} - Ib\right) \cdot \left(\frac{R3}{Rtotal(R4, R5)} - 1\right)\right]$$

and a gain term:

$$Igain = \frac{1}{2} \cdot \left(IL \cdot \frac{Rtotal(R2, R108)}{R1}\right) \cdot \left(\frac{R3}{Rtotal(R4, R5)} - 1\right) \qquad (12)$$

In order to cancel the offset Ioffset, which is not compensated in process and temperature, it is possible to impose:

$$Ia \cdot \frac{Rtotal(R2, R108) + Roffset}{R1} = Ib \qquad (13)$$

Since the term Rtotal(R2, R108) is negligible compared with R2 (for example, R2≈1 kOhm and R108≈50 mOhm), then it is possible to cancel any offset by imposing:

$$Ia \cdot \frac{Roffset}{R1} = Ib \qquad (14)$$

Igain may be written as follows:

$$Igain = \frac{1}{2} \cdot \left(IL \cdot \frac{Rtotal(R2, R108)}{R1}\right) \cdot \left(\frac{R3}{Rtotal(R4, R5)} - 1\right) = \qquad (15)$$
$$\frac{1}{2} \cdot IL \cdot \left(\frac{Rtotal(R2, R108)}{R1} \cdot \frac{R3}{Rtotal(R4, R5)} - \frac{Rtotal(R2, R108)}{R1}\right)$$

Igain includes the following two terms:

$$\frac{1}{2} \cdot IL \cdot \left(\frac{Rtotal(R2, R108)}{R1} \cdot \frac{R3}{Rtotal(R4, R5)}\right) \qquad (16)$$

$$\frac{1}{2} \cdot IL \cdot \left(\frac{Rtotal(R2, R108)}{R1}\right) \qquad (17)$$

Term (16) is compensated, as R3/R1 varies with process and temperature the same way as Rtotal(R3, R108)/Rtotal(R4, R5).

Term (17) is not compensated but, since the term Rtotal(R2, R108) is negligible if R2 and R1 are in the order of kOhm and R108 is in the order of mOhms, the overall number is in the order of mOhm/kOhm.

Figure 11:
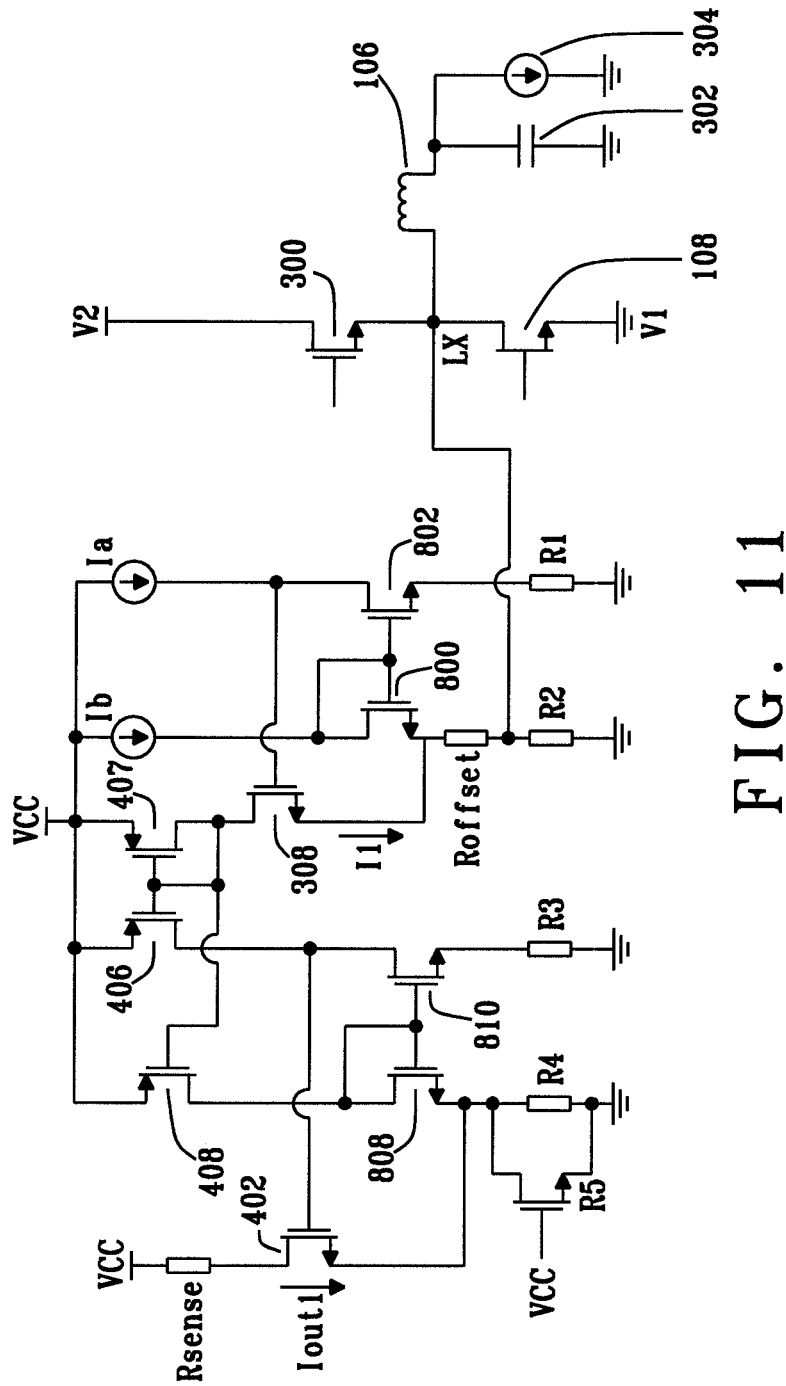
FIG. 11 is a schematic of the apparatus of FIG. 1 for a specific embodiment of the stages for use with a low side switch.

FIG. 11 is a schematic of the apparatus 100 for a specific embodiment of the stages 200, 202 for use with a low side switch 108.

Figures 12A, 12B:
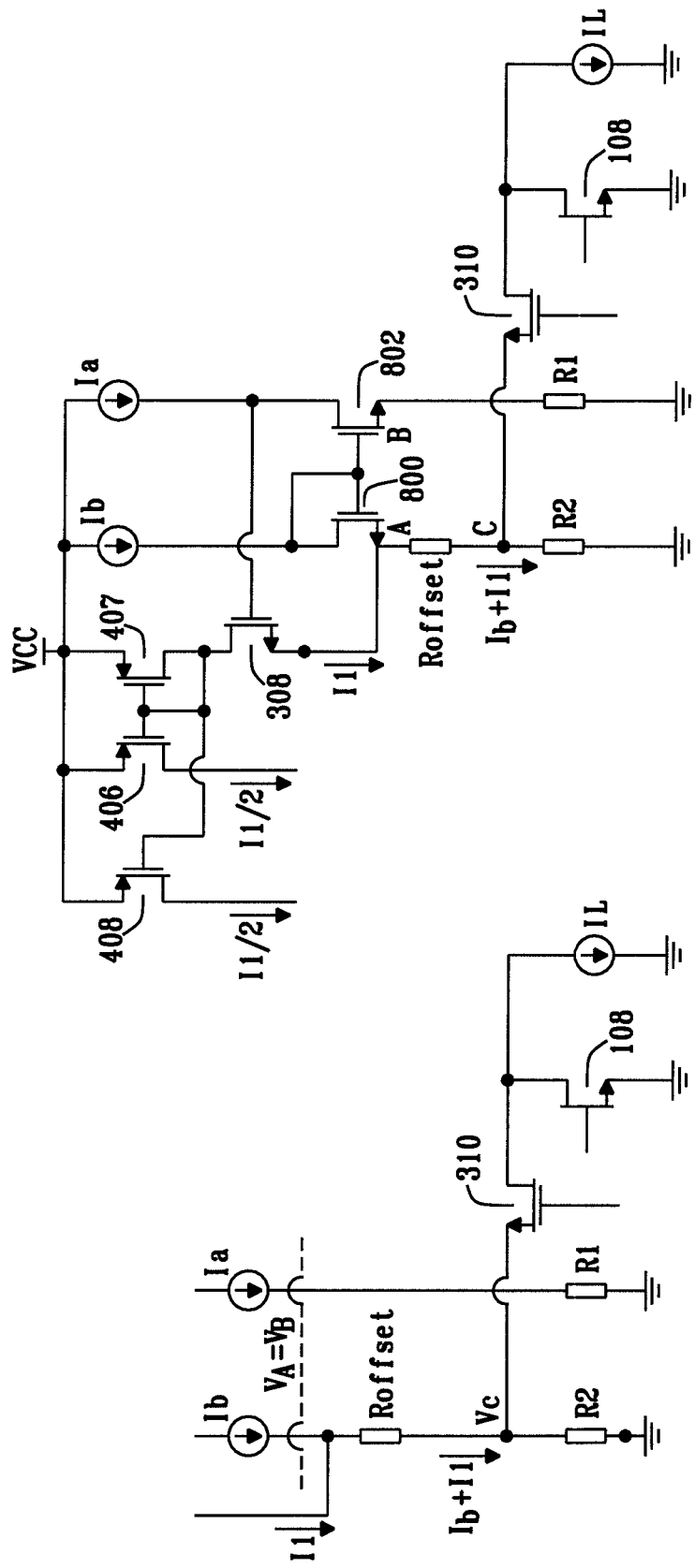
FIG. 12A is a schematic illustrating current flows through the first stage of the apparatus of FIG. 11.
FIG. 12B is a further schematic illustrating current flows through the first stage of the apparatus of FIG. 11.

FIG. 12A and FIG. 12B are schematics illustrating current flows through the first stage 200 of the apparatus of FIG. 11.

Figure 13B:
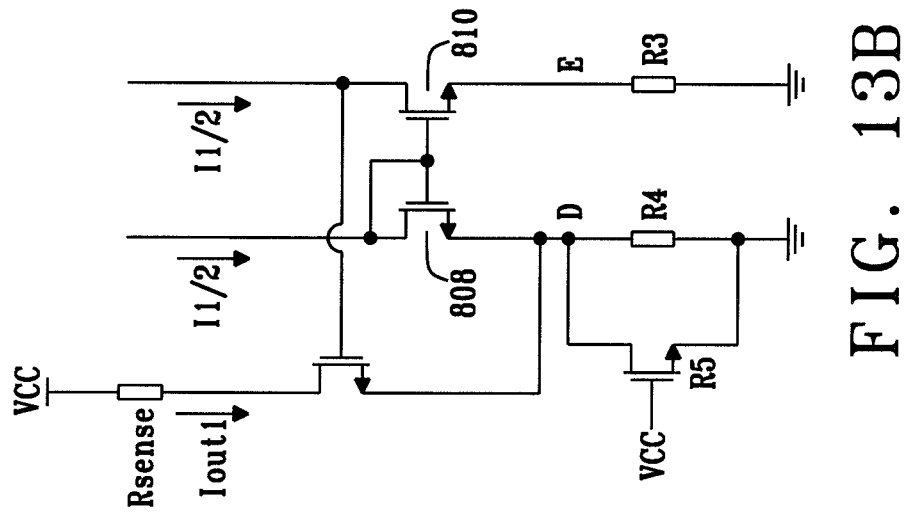
FIG. 13B is a further schematic illustrating current flows through the second stage of the apparatus of FIG. 11.
Figure 13A:
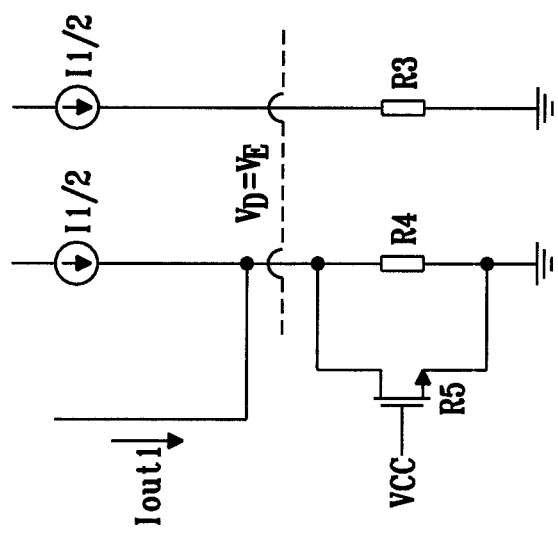
FIG. 13A is a schematic illustrating current flows through the second stage of the apparatus of FIG. 11.

FIG. 13A and FIG. 13B are schematics illustrating current flows through the second stage 202 of the apparatus of FIG. 11.

The following is provided as analysis for the first stage 200 for low side switch current sensing.

The feedback loop forces node "A" equal to node "B", assuming that the resistance of the switch 310 is negligible compared with R2.

$$V_A = (Ib+I1) \cdot \text{Roffset} + V_C \qquad (18)$$

$$V_B = Ia \cdot R1 \qquad (19)$$

$$V_C = (Ib+I1) \cdot Rtotal(R2, R108) - IL \cdot Rtotal(R2, R108) \qquad (20)$$

Rtotal(R2, R108) is the total resistance of the parallel combination of the resistive element R2 and the switch 108, where R108 is the resistance of the switch 108.

Imposing $V_A = V_B$ yields the following relation:

$$(Ib+I1) \cdot \text{Roffset} + (Ib+I1) \cdot Rtotal(R2, R108) - IL \cdot Rtotal(R2, R108) = Ia \cdot R1 \qquad (21)$$

The output current of the first stage 200 is:

$$I1 = \qquad (22)$$
$$IL \cdot \frac{Rtotal(R2, R108)}{Roffset + Rtotal(R2, R108)} + Ia \cdot \frac{R1}{Roffset + Rtotal(R2, R108)} - Ib$$

The following is provided as analysis for the second stage 202 for low side switch current sensing.

The feedback loop forces node "D" equal to node "E".

$$V_D = \left(Iout1 + \frac{I1}{2}\right) \cdot Rtotal(R4, R5) \qquad (23)$$

Rtotal(R4, R5) is the total resistance of the parallel combination of the resistive elements R4, R5.

$$V_E = \frac{I1}{2} \cdot R3 \qquad (24)$$

Imposing $V_D = V_E$:

The output current Iout1 of the second stage 202 is:

$$Iout1 = \frac{I1}{2} \cdot \left(\frac{R3}{Rtotal(R4, R5)} - 1\right) = \frac{I1}{2} \cdot \left(\frac{R3 - Rtotal(R4, R5)}{Rtotal(R4, R5)}\right) \qquad (25)$$

We may then consider the combinations of the gain functions provided by the first and second stages 200, 202.

The output current I1 of the first stage 200 is provided by equation (22). The output current Iout1 of the second stage 202 is provided by equation (25). Combining these equations yields the following:

$$Iout1 = \frac{1}{2} \cdot \left[IL \cdot \frac{Rtotal(R2, R108)}{Roffset + Rtotal(R2, R108)} \cdot \left(\frac{R3}{Rtotal(R4, R5)} - 1\right) + \qquad (26)\right.$$

-continued $$\left(Ia\frac{R1}{(Roffset+Rtotal(R2,R108))}-Ib\right)\cdot\left(\frac{R3}{Rtotal(R4,R5)}-1\right)\right]$$

Equation (26) includes an offset term:

$$Ioffset = \quad (27)$$
$$\frac{1}{2}\cdot\left(Ia\cdot\frac{R1}{Roffset+Rtotal(R2,R108)}-Ib\right)\cdot\left(\frac{R3}{Rtotal(R4,R5)}-1\right)\right]$$

and a gain term:

$$Igain = \frac{1}{2}\cdot\left(IL\cdot\frac{Rtotal(R2,R108)}{Roffset+Rtotal(R2,R108)}\right)\cdot\left(\frac{R3}{Rtotal(R4,R5)}-1\right) \quad (28)$$

In order to cancel the offset Ioffset, which is not compensated in process and temperature, it is possible to impose:

$$Ia\cdot\frac{R1}{(Roffset+Rtotal(R2,R108))}=Ib \quad (29)$$

Since the term Rtotal(R2, R108) is negligible compared with Roffset (for example, Roffset≈1 kOhm and R108≈50 mOhm), then it is possible to cancel any offset by imposing:

$$Ia\cdot\frac{R1}{Roffset}=Ib \quad (30)$$

Igain may be written as follows:

$$Igain = \frac{1}{2}\cdot\left(IL\cdot\frac{Rtotal(R2,R108)}{Roffset+Rtotal(R2,R108)}\right)\cdot\left(\frac{R3}{Rtotal(R4,R5)}-1\right)= \quad (31)$$
$$\frac{1}{2}\cdot IL\cdot\left(\frac{Rtotal(R2,R108)}{(Roffset+Rtotal(R2,R108))}\cdot\frac{R3}{Roffset(R4,R5)}-\frac{Rtotal(R2,R108)}{(Roffset+Rtotal(R2,R108))}\right)$$

Igain includes the following two terms:

$$\frac{1}{2}\cdot IL\cdot\left(\frac{Rtotal(R2,R108)}{Roffset+Rtotal(R2,R108)}\cdot\frac{R3}{Roffset(R4,R5)}\right) \quad (32)$$

$$\frac{1}{2}\cdot IL\cdot\left(\frac{Rtotal(R2,R108)}{(Roffset+Rtotal(R2,R108))}\right) \quad (33)$$

By considering the approximation that:

$$Roffset \gg Rtotal(R2,R108)\approx R108 \quad (34)$$

(for example, Roffset in the order of kOhm and R108 in the order of mOhm), the term (32) can be written as follows:

$$\frac{1}{2}\cdot IL\cdot\frac{Rtotal(R2,R108)}{Roffset}\cdot\frac{R3}{Rtotal(R4,R5)} \quad (35)$$

With this approximation, we can assume that R3 and Roffset have the same variation with process and temperature, as well as Rtotal(R2, R108) and Rtotal(R4, R5) and the term is therefore compensated with process and temperature variation.

Considering the approximation given by (34), the term (33) may be written as:

$$\frac{1}{2}\cdot IL\cdot\frac{Rtotal(R2,R108)}{Roffset} \quad (36)$$

This term is not compensated but, since the term Rtotal (R2, R108) is negligible if Roffset is in the order of kOhm and R108 is in the order of mOhms, the term is negligible.

In summary, the output current Iout1 is composed of two terms: one is proportional to the inductor current IL and the other is an offset.

The offset term is partially compensated in temperature and can be nulled with the appropriate choice of component values. The gain term is also partially compensated against process and temperature; the residual part not compensated can be negligible with the appropriate choice of component values.

DC sweep test simulations were performed for practical implementations of the apparatuses shown in FIGS. 8 and 11 whilst ILOAD varies from 0 to 5A.

The following parameters were used for the simulation:
NMOS switches for the high side and low side switches (108a, 108b)
V1a from 4.5V to 42V
VCC 5V+/−10%
Current sense gain: 50 μA/A
Maximum current, I_max=5A
The DC sweep test was run for the following conditions:
Temp=[−40:150]C
ACTIVE_STD=[ff ss fnsp_tbip snfp_tbip]
ACTIVE_HV=[ff ss fnsp snfp]
Passive_tsmc=[pass_lo pass_nom pass_hi]

Figure 14:
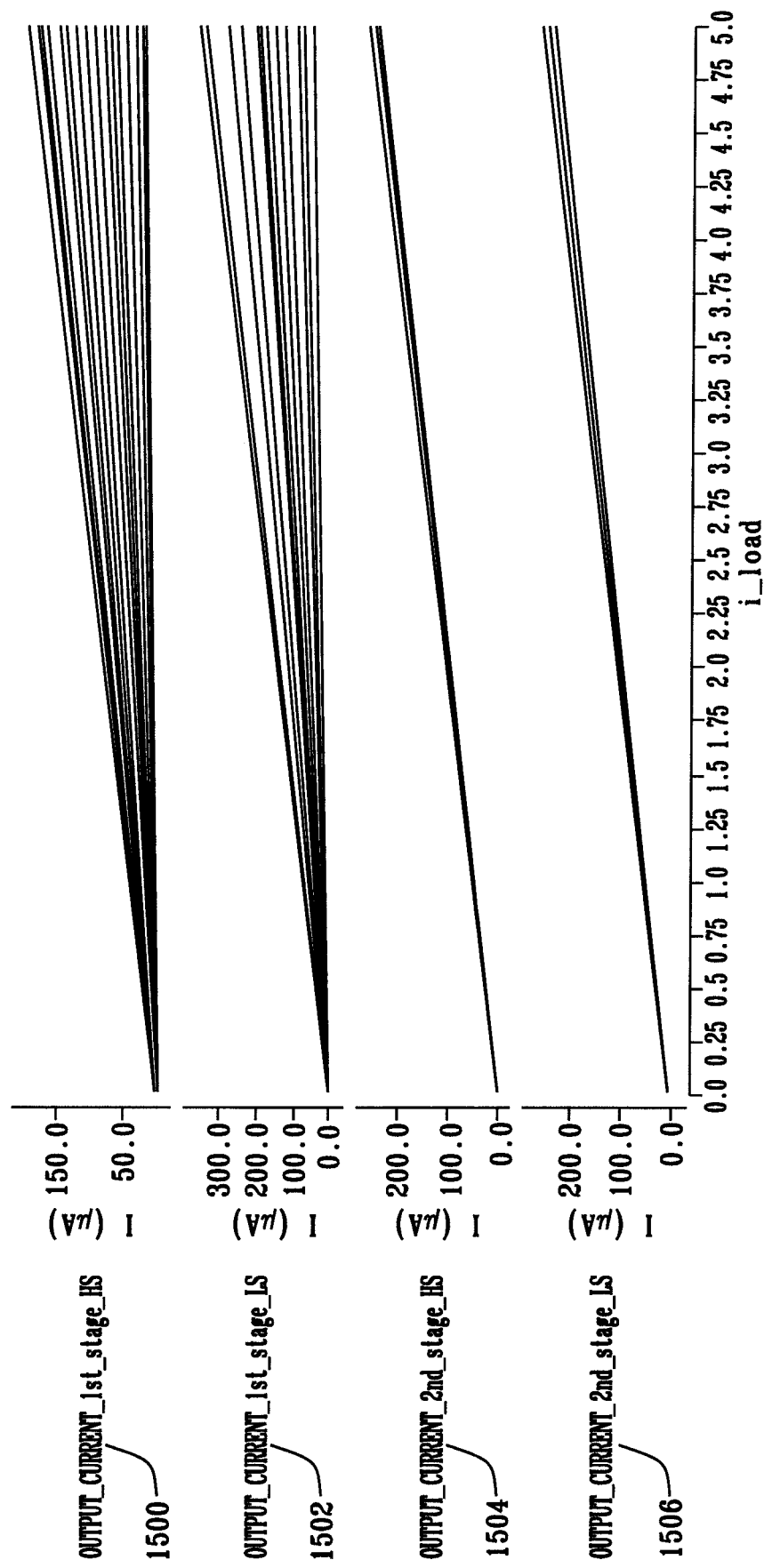
FIG. 14 is a graph showing the results for the DC sweep of the simulation of the circuit of FIG. 6.

FIG. 14 is a graph showing the results for the DC sweep of the simulation of the circuit of FIG. 6. Shown on the graph are traces 1500 of the current I1a, traces 1502 of the current I1b, traces 1504 of the current Iout1a and traces 1506 of the current Iout1b across the DC sweep of V1a.

Figure 15A:
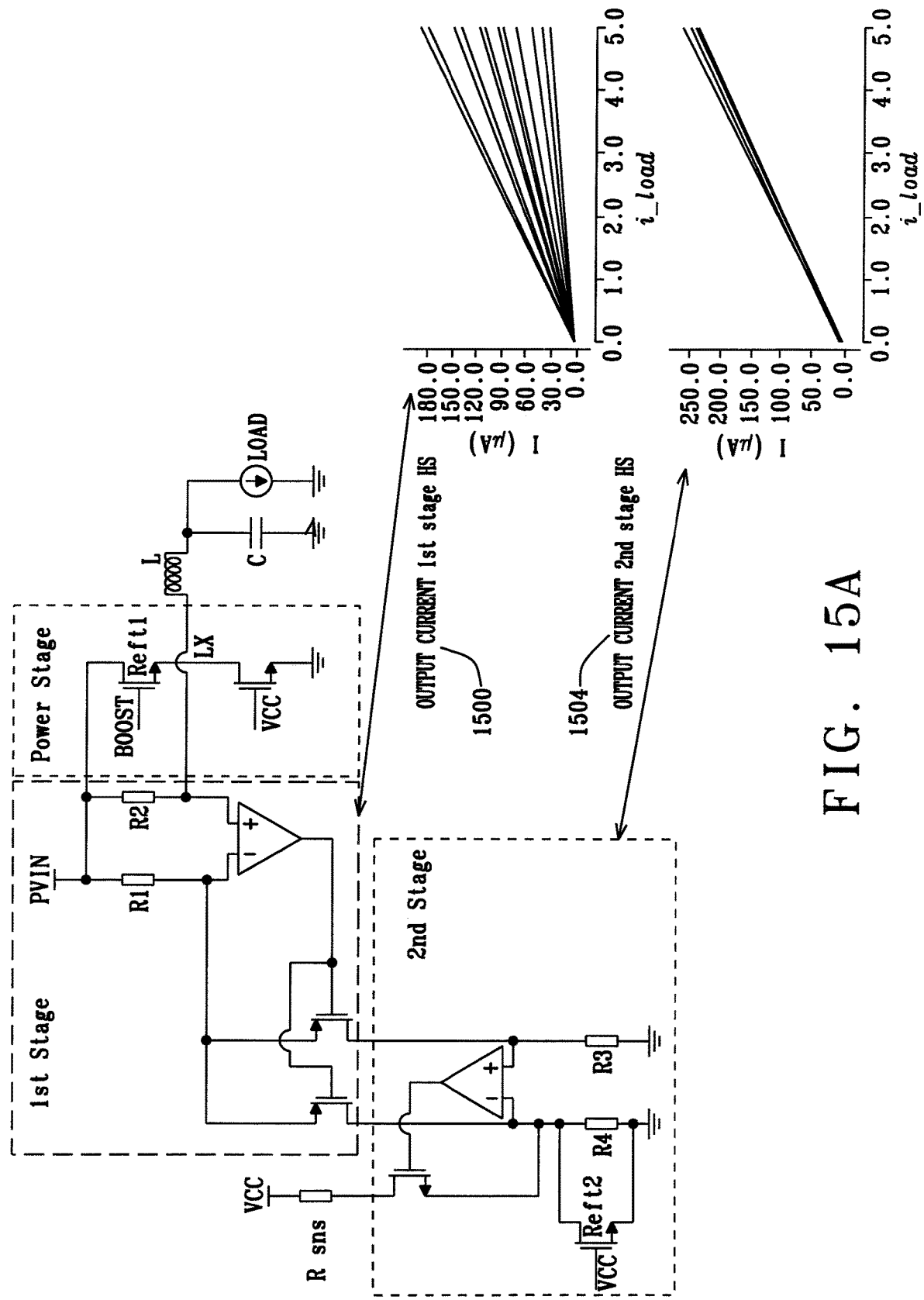
FIG. 15A shows the results of the simulation for the high side current sensor, including a schematic.

FIG. 15A shows the results of the simulation for the high side current sensor, including a schematic.

Figure 15B:
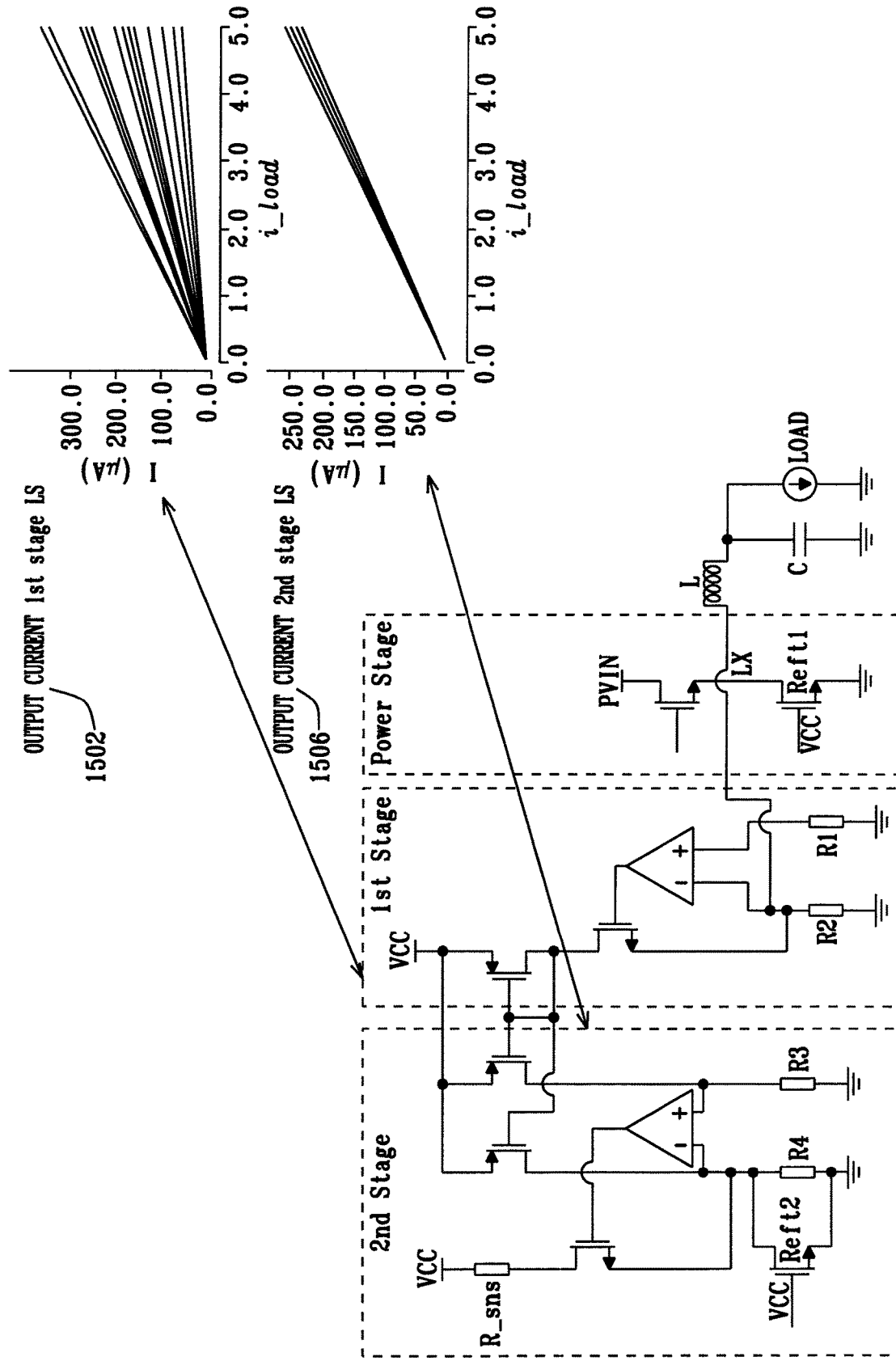
FIG. 15B shows the results of the simulation for the low side current sensor, including a schematic.

FIG. 15B shows the results of the simulation for the low side current sensor, including a schematic.

In the first stage 200 the current has a large variation, because it includes the temperature variation and the load information at the same time. The second stage 204 removes the temperature variation thereby compressing the spread of the output current Iout1a, Iout1b across PVT.

The table below shows the datapoints related to the DC sweep simulation across PVT. The error of measurement from the first stage is in the order of hundred percent, while the error in the second stage is compressed down to few unit of percentage.

TABLE 1

| | | Min (uA) | Nom (uA) | Max (uA) | Min error (%) | Max error (%) |
|---|---|---|---|---|---|---|
| | | Slope/Intercept/RSQ across PVT-High Side | | | | |
| High Side | HS_1st_stage_1A | 5.54 | 16.20 | 39.00 | −66% | 141% |
| | HS_1st_stage_2A | 10.90 | 32.20 | 78.10 | −66% | 143% |
| | HS_1st_stage_3A | 16.40 | 48.30 | 118.00 | −66% | 144% |
| | HS_1st_stage_4A | 21.80 | 64.50 | 157.00 | −66% | 143% |
| | HS_1st_stage_5A | 27.30 | 80.70 | 197.00 | −66% | 144% |
| | HS_2nd_stage_1A | 49.30 | 51.50 | 54.30 | −4% | 5% |
| | HS_2nd_stage_2A | 97.40 | 102.00 | 104.00 | −5% | 2% |
| | HS_2nd_stage_3A | 147.00 | 152.00 | 155.00 | −3% | 2% |
| | HS_2nd_stage_4A | 196.00 | 203.00 | 207.00 | −3% | 2% |
| | HS_2nd_stage_5A | 246.00 | 253.00 | 259.00 | −3% | 2% |
| Low Side | LS_1st_stage_1A | 11.40 | 29.20 | 74.00 | −61% | 153% |
| | LS_1st_stage_2A | 22.70 | 58.50 | 148.00 | −61% | 153% |
| | LS_1st_stage_3A | 34.00 | 87.90 | 222.00 | −61% | 153% |
| | LS_1st_stage_4A | 45.50 | 117.00 | 295.00 | −61% | 152% |
| | LS_1st_stage_5A | 56.90 | 147.00 | 363.00 | −61% | 147% |
| | LS_2nd_stage_1A | 49.00 | 51.50 | 56.10 | −5% | 9% |
| | LS_2nd_stage_2A | 98.90 | 102.00 | 107.00 | −3% | 5% |
| | LS_2nd_stage_3A | 148.00 | 152.00 | 158.00 | −3% | 4% |
| | LS_2nd_stage_4A | 196.00 | 202.00 | 210.00 | −3% | 4% |
| | LS_2nd_stage_5A | 240.00 | 252.00 | 261.00 | −5% | 4% |

It should be noted that optimisation for resistors values and replica device values has not been performed, so it will be possible to achieve an improvement on these results. Looking at the linearity of the output current Iout1a, Iout1b, it is possible to notice that either the first or second stage 200, 202 output currents have very high RSQ coefficient. The slope in the first stage 200 has a considerable variation as the output current I1a, I1b is not compensated across process and temperature variation.

The output current Iout1a, Iout1b of the second stage 202, which implements the same uncompensated function but inverted, has a much more reduced slope variation.

TABLE 2

| | Min | Nom | Max |
|---|---|---|---|
| Slope/Intercept/RSQ across PVT-High Side | | | |
| Slope 1st stage (uA/A) | 6.3125 | 15.8268 | 37.8875 |
| Intercept 1st stage (uA) | 0.2268 | 0.3365 | 0.5446 |
| RSQ 1st stage | 1.0000 | 0.9999 | 0.9998 |
| Slope 2nd stage (uA/A) | 46.9025 | 49.5907 | 50.6850 |
| Intercept 2nd stage (uA) | 0.5225 | 1.8164 | 3.3936 |
| RSQ 2nd stage | 0.9999 | 0.9999 | 0.9997 |

TABLE 3

| | Min | Nom | Max |
|---|---|---|---|
| Slope/Intercept/RSQ across PVT-Low Side | | | |
| Slope 1st stage (uA/A) | 11.797 | 29.740 | 68.373 |
| Intercept 1st stage (uA) | 27.358 | −1.166 | 163.805 |
| RSQ 1st stage | 0.9990 | 0.9998 | 0.9998 |
| Slope 2nd stage (uA/A) | 44.929 | 49.377 | 50.697 |
| Intercept 2nd stage (uA) | −0.338 | −0.975 | 0.330 |
| RSQ 2nd stage | 0.9994 | 0.9999 | 0.9999 |

The data in the tables above, show the functioning of the current sensors of the present disclosure.

Transient test simulations were performed for a practical implementation of the apparatus shown in FIG. 6 with the switching converter operating in PWM mode and the load varying from 0A to 4A with 1A of peak to peak current ripple.

The following parameters were used for the simulation:
DC load from 1 to 4 A
I_ripple=1 Apk_pk
fsw=1 MHz
V1a=12V
VCC=[4.5; 5.5]
Temp=[−40; 150]
The transient test was run for the following conditions:
ACTIVE_STD =[ff ss fnsp_tbip snfp_tbip]
ACTIVE_HV =[ff ss fnsp snfp]
Passive_tsmc=[pass_lo pass_nom pass_hi]

Figure 16:
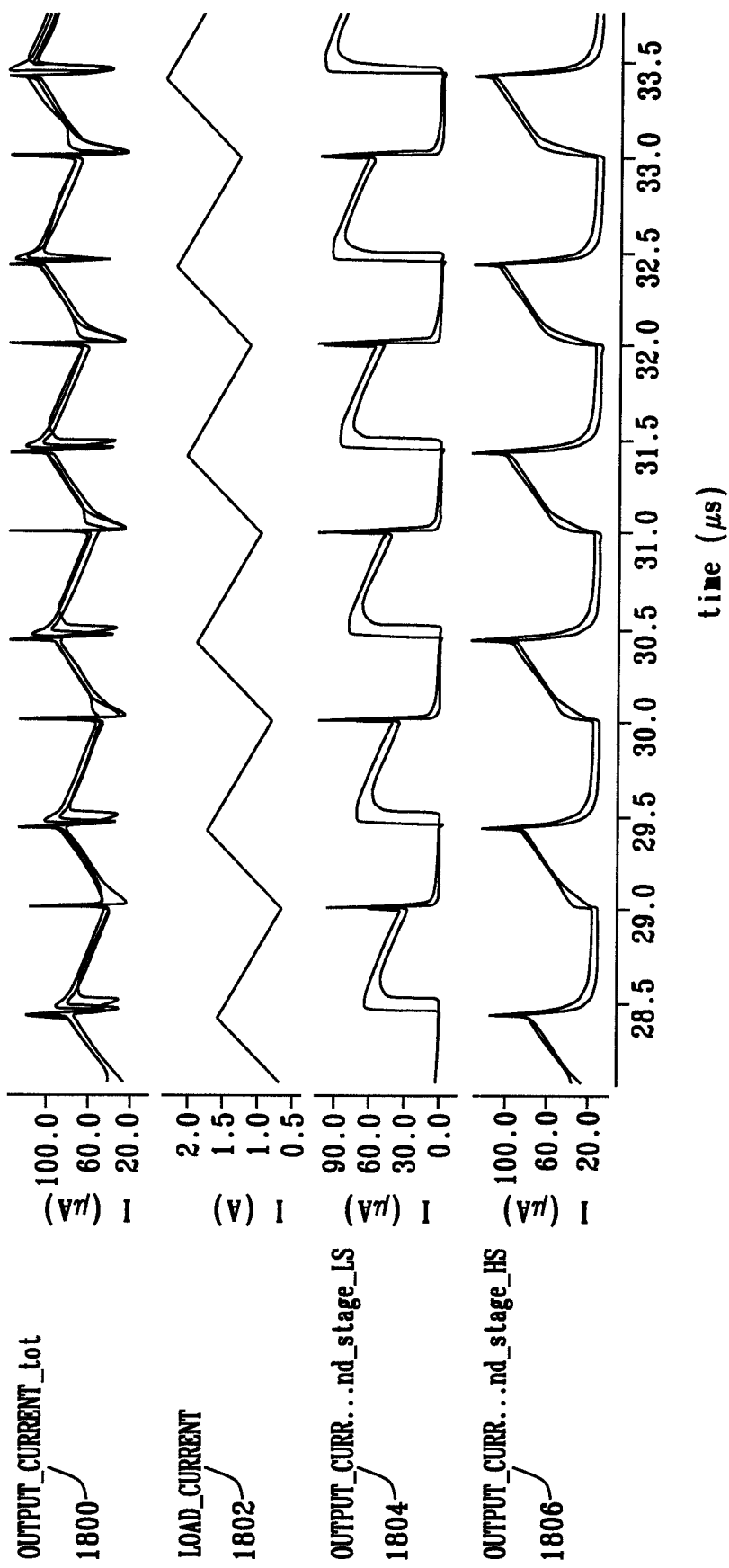
FIG. 16 is a graph showing the results for the transient test of the simulation of the circuit of FIG. 6 for a low load.

FIG. 16 is a graph showing the results for the transient test of the simulation of the circuit of FIG. 6 for a low load. Shown on the graph are traces 1800 of the total output current Itotal, traces 1802 of the load current, traces 1804 of the output current Iout1b and traces 1806 of the output current Iout1a.

Figure 17:
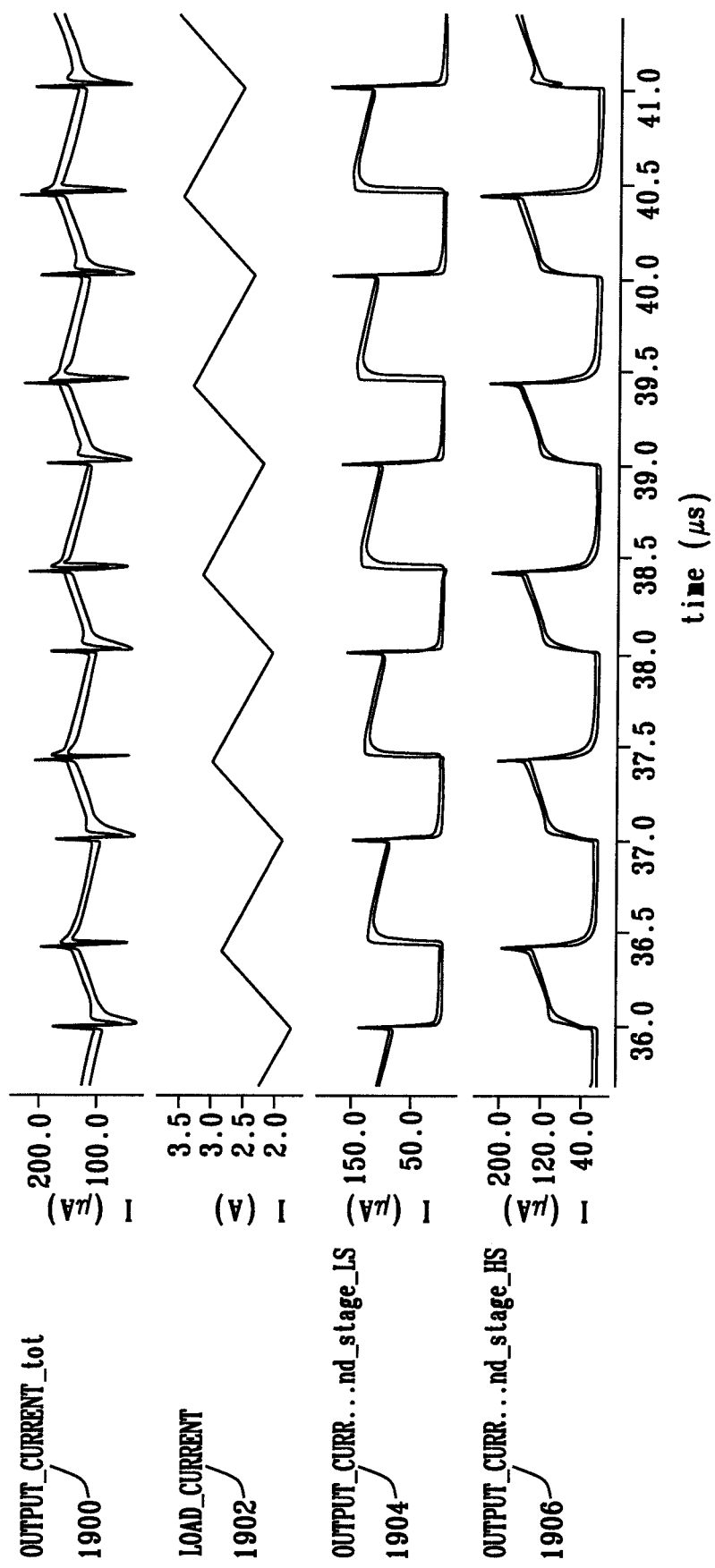
FIG. 17 is a graph showing the results for the transient test of the simulation of the circuit of FIG. 6 for a medium load.

FIG. 17 is a graph showing the results for the transient test of the simulation of the circuit of FIG. 6 for a medium load. Shown on the graph are traces 1900 of the total output current Itotal, traces 1902 of the load current, traces 1904 of the output current Iout1b and traces 1906 of the output current Iout1a.

Figure 18:
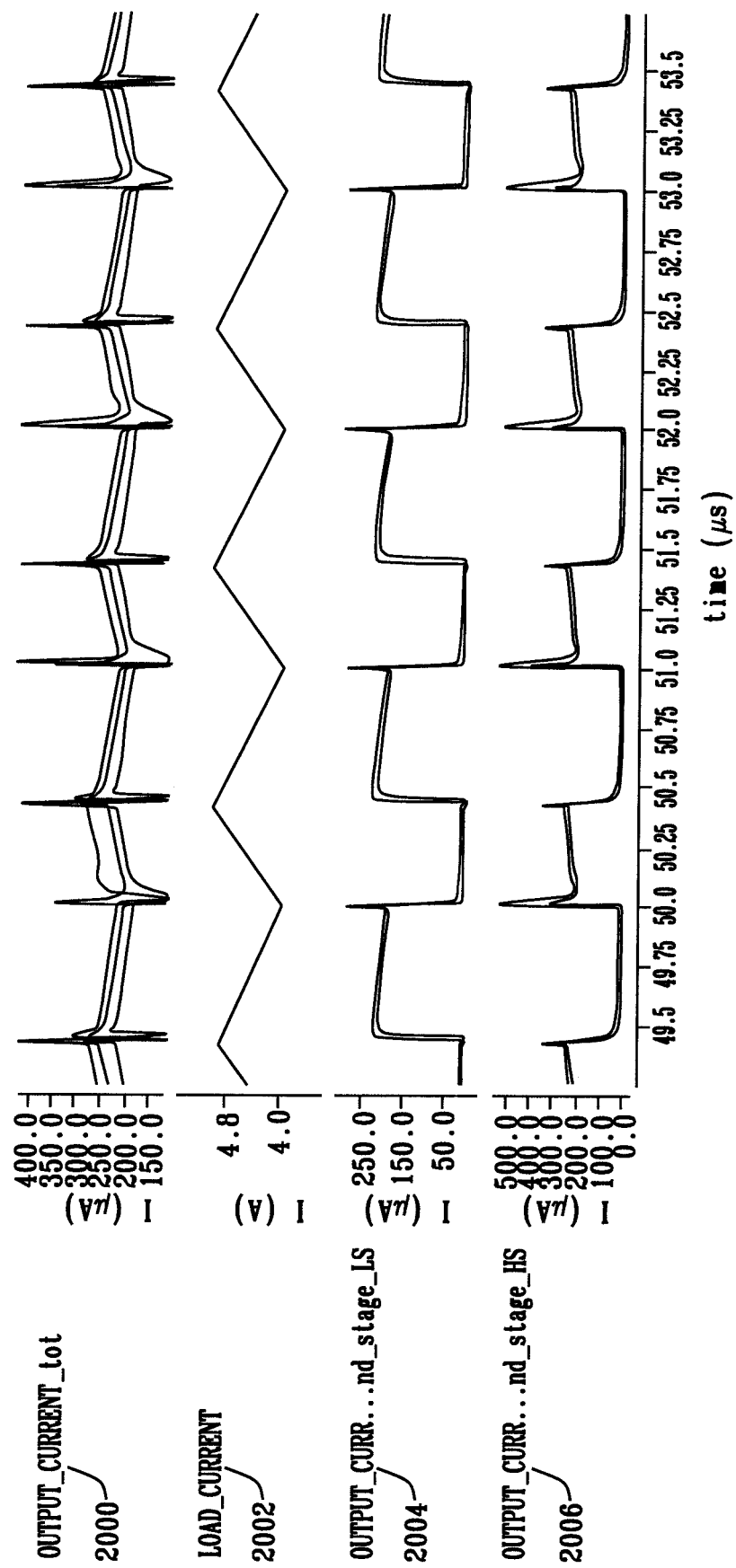
FIG. 18 is a graph showing the results for the transient test of the simulation of the circuit of FIG. 6 for a high load.

FIG. 18 is a graph showing the results for the transient test of the simulation of the circuit of FIG. 6 for a high load. Shown on the graph are traces 2000 of the total output current Itotal, traces 2002 of the load current, traces 2004 of the output current Iout1b and traces 2006 of the output current Iout1a.

Advantages of the current sensing methods described herein include:
High voltage and low voltage operation
Self-compensated against process and temperature
No trimming for gain is necessary
Design suitable for PMOS/NMOS high side and low side switches The current sensing methods as described herein provide improved current measurement accuracy as they reduce errors arising, for example, due to temperature variations and/or process variations.

The current measurements may, for example, be used as an output of the system for a user to determine whether the system is functioning correctly. Alternatively, or in addition to, providing the current measurement as an output to the user, the current measurement may be used internally by the system to control certain operations, to evaluate the functioning of the system and/or to take action in response to a specific current measurement, for example if it is indicative of a problem within the system.

Various improvements and modifications may be made to the above without departing from the scope of the disclosure.

What is claimed is:

1. An apparatus comprising a first current sensor for a switching converter comprising an inductor and a first switch, the first switch being arranged to selectively couple the inductor to a first voltage, the first current sensor being configured to:
   i) generate a first output current that is dependent on an inductor current flowing through the inductor; and
   ii) at least partially compensate for an error arising due to the first switch in the generation of the first output current, wherein;
   the first current sensor comprises a first stage configured to generate a first current that is dependent on the inductor current, the first current comprising a current error, the current error resulting from the error arising due to the first switch; and
   a second stage configured to:
      i) receive the first current; and
      ii) generate the first output current by at least partially compensating for the current error of the first current and wherein the first stage comprises:
   a first differential amplifier;
   a first resistive element;
   a second resistive element configured to be couplable to the first switch in a parallel coupling configuration, wherein:
   the first differential amplifier is configured to generate the first current that is dependent on the impedances of the first resistive element, the second resistive element and the first switch, wherein:
   an output of the first differential amplifier is coupled to a gate of a first transistor a negative input of the first differential amplifier is coupled to a first terminal of the first transistor.

2. The apparatus of claim 1, wherein the error arises due to an impedance of the first switch.

3. The apparatus of claim 1, wherein the error arises due to a temperature dependency of an impedance of the first switch, and/or an offset in a physical value of the impedance of the first switch from an intended value of the impedance.

4. The apparatus of claim 1, wherein the second stage comprises:
   a second differential amplifier;
   a third resistive element;
   a fourth resistive element; and
   a fifth resistive element coupled in parallel with the fourth resistive element, thereby forming a parallel combination; wherein:
   the second differential amplifier is configured to generate the first output current that is dependent on the first current and the impendences of the third, fourth and fifth resistive elements.

5. The apparatus of claim 4, wherein an output of the second differential amplifier is coupled to a gate of a second transistor, a negative input of the second differential amplifier is coupled to a first terminal of the second transistor.

6. The apparatus of claim 4, wherein:
   the third resistive element is coupled to a positive input of the second differential amplifier; and
   the parallel combination of the fourth and fifth resistive elements is coupled to a negative input of the second differential amplifier.

7. The apparatus of claim 4, wherein the third resistive element is configured to receive a first portion of the first current and the parallel combination of the fourth and fifth resistive elements are configured to receive a second portion of the first current.

8. The apparatus of claim 4, wherein the second stage comprises a current divider configured to:
   divide the first current into a first portion and a second portion;
   provide the first portion of the first current to the third resistive element; and
   provide the second portion of the first current to the parallel combination of the fourth and fifth resistive elements.

9. The apparatus of claim 1, wherein the first switch comprises a high side switch, the high side switch comprising a first terminal coupled to the first voltage and a second terminal coupled to the inductor at an inductor node.

10. The apparatus of claim 9, wherein the first current sensor comprises:
    a first stage configured to generate a first current that is dependent on the inductor current, the first current comprising a current error, the current error resulting from the error arising due to the first switch; and
    a second stage configured to:
       i) receive the first current; and
       ii) generate the first output current by at least partially compensating for the current error of the first current.

11. The apparatus of claim 10, wherein the first stage comprises:
    a first differential amplifier
    a first resistive element;
    a second resistive element configured to be couplable to the first switch in a parallel coupling configuration; wherein:
    the first differential amplifier is configured to generate the first current that is dependent on the impedances of the first resistive element, the second resistive element and the first switch.

12. The apparatus of claim 1, wherein the first switch comprises a low side switch, the low side switch comprising a first terminal coupled to the first voltage and a second terminal coupled to an inductor at an inductor node.

13. The apparatus of claim 1, wherein the switching converter comprises a second switch, the second switch being arranged to selectively couple the inductor to a second voltage, the apparatus comprising a second current sensor being configured to:
    i) generate a second output current that is dependent on the inductor current flowing through the inductor; and
    ii) at least partially compensate for an error arising due to the second switch in the generation of the second output current.

14. The apparatus of claim 1 comprising the switching converter.

15. A method of current sensing an inductor current of a switching converter comprising an inductor and a first switch, the first switch being arranged to selectively couple the inductor to a first voltage, the method comprising:
   i) generating a first output current that is dependent on the inductor current flowing through the inductor using a first current sensor; and
   ii) compensating, at least partially, for an error arising due to the first switch in the generation of the first output current using the first current sensor, wherein:
   the first current sensor comprises a first stage configured to generate a first current that is dependent on the inductor current, the first current comprising a current error, the current error resulting from the error arising due to the first switch; and
   a second stage configured to:
      i) receive the first current; and
      ii) generate the first output current by at least partially compensating for the current error of the first current and wherein the first comprises:
         a first differential amplifier;
         a first resistive element;
         a second resistive element configured to be couplable to the first switch in a parallel coupling configuration, wherein:
         the first differential amplifier is configured to generate the first current that is dependent on the impedances of the first resistive element, the second resistive element and the first switch, wherein:
      an output of the first differential amplifier is coupled to a gate of a first transistor a negative input of the first differential amplifier is coupled to a first terminal of the first transistor.

16. The method of claim 15, comprising:
   iii) generating a second output current that is dependent on the inductor current flowing through the inductor using a second current sensor; and
   iv) compensating, at least partially, for an error arising due to the second switch in the generation of the second output current using the second current sensor.

17. The method of claim 16 comprising generating a total output current that comprises the first and second output currents.

* * * * *